United States Patent
Hirosawa

(10) Patent No.: US 9,577,217 B2
(45) Date of Patent: Feb. 21, 2017

(54) ORGANIC ELECTROLUMINESCENT ELEMENT

(71) Applicant: Konica Minolta, Inc., Chiyoda-ku, Tokyo (JP)

(72) Inventor: Shota Hirosawa, Hino (JP)

(73) Assignee: KONICA MINOLTA, INC., Tokyo (JP)

(*) Notice: Subject to any disclaimer, the term of this patent is extended or adjusted under 35 U.S.C. 154(b) by 0 days.

(21) Appl. No.: 14/831,352

(22) Filed: Aug. 20, 2015

(65) Prior Publication Data

US 2016/0056413 A1   Feb. 25, 2016

(30) Foreign Application Priority Data

Aug. 22, 2014   (JP) ................. 2014-168950

(51) Int. Cl.
    *H01L 51/52*   (2006.01)
(52) U.S. Cl.
    CPC ....... *H01L 51/5253* (2013.01); *H01L 51/5243* (2013.01); *H01L 51/5246* (2013.01); *H01L 2251/301* (2013.01); *H01L 2251/5338* (2013.01); *H01L 2251/5346* (2013.01); *H01L 2251/558* (2013.01)
(58) Field of Classification Search
    CPC ............. H01L 51/5253; H01L 51/5243; H01L 51/5256; H01L 51/524; H01L 51/5246
    See application file for complete search history.

(56) References Cited

U.S. PATENT DOCUMENTS

| 6,624,568 | B2* | 9/2003 | Silvernail | ........... H01L 51/5237 313/504 |
| 6,815,887 | B2* | 11/2004 | Lee | ................. H01L 51/5221 313/504 |
| 8,034,419 | B2* | 10/2011 | Erlat | ....................... C23C 16/30 204/192.1 |
| 2004/0046497 | A1* | 3/2004 | Schaepkens | ........... B82Y 20/00 313/506 |
| 2005/0082971 | A1* | 4/2005 | Couillard | ............ H01L 51/5253 313/511 |
| 2009/0110892 | A1* | 4/2009 | Erlat | ....................... C23C 16/30 428/213 |

FOREIGN PATENT DOCUMENTS

| JP | 2014109001 A | 6/2014 |
| WO | 2004101276 A1 | 11/2004 |

* cited by examiner

*Primary Examiner* — Anne Hines
(74) *Attorney, Agent, or Firm* — Cantor Colburn LLP

(57) ABSTRACT

The present invention provides an organic electroluminescent element containing: a first gas barrier layer; an intermediate layer; a second gas barrier layer; a third gas barrier layer; a first electrode; an organic functional layer; and a second electrode, in that order, wherein the intermediate layer contains a resin and has a thickness of 10 μm to 250 μm; the second gas barrier layer contains silicon, carbon and oxygen, wherein a composition of silicon, carbon and oxygen contained in the second gas barrier layer is continuously changed in a thickness direction of the second gas barrier layer, and distribution curves of silicon, carbon and oxygen each have an extremum point; and the third gas barrier layer is a polysilazane reforming layer.

5 Claims, 3 Drawing Sheets

ORGANIC ELECTROLUMINESCENT ELEMENT

CROSS REFERENCE TO RELATED APPLICATIONS

The present invention claims priority under 35 U.S.C. §119 to Japanese Application No. 2014-168950 filed on Aug. 22, 2014, the entire content of which is incorporated herein by reference.

TECHNICAL FIELD

The present invention relates to an organic electroluminescent element.
More specifically, the present invention relates to an organic electroluminescent element which has achieved high storage stability.

BACKGROUND

An organic electroluminescence element (organic EL element) is a thin-type complete solid element utilizing electroluminescence produced by an organic material (hereafter, the term "electroluminescence" is also simply called as "EL") and enabling to emit light at a voltage of approximately a few to a few tens volts. It has excellent features of high luminance, high emission efficiency, thin-type, and lightweight. Therefore, particularly in recent years, an organic EL element using a resin substrate provided with a thin and lightweight gas barrier layer attracts attention as a surface-emitting body used for a backlight in various displays, a display panel of sign or emergency light, or an illuminating light source.

As a resin substrate for a flexible organic EL element, for example, a gas barrier substrate utilizing a polysilazane reforming layer is disclosed (for example, refer to JP-A No. 2014-109001). The present inventors have tried to produce an organic EL element having a thick gas barrier layer. It was found that the produced organic EL element generated cracks when it was bent, and its gas barrier ability was seriously deteriorated.

It was disclosed a gas barrier substrate composed of a functional layer of a thickness of 1 μm to 30 μm sandwiched between two gas barrier layers (for example, refer to WO 2004/101276). The present inventors have tried to produce an organic EL element using a gas barrier substrate composed of a functional layer between two gas barrier layers. It was found that high gas barrier ability can be obtained even when it was bent, however, it was found that high gas barrier ability was insufficient in a durability test under an accelerated condition by using a heat cycle. An example of a heat cycle is as follows: to keep the sample at 85° C. and 85% RH for 120 minutes; to decrease the temperature to −40° C. over a period of 90 minutes and to keep at −40° C. for 120 minutes; and to increase the temperature to 85° C. (with humidity of 85% RH) over a period of 90 minutes and to keep at 85° C. for 80 minutes. A durability test was done by repeating 100 times of the above-described heat cycle processes. It was also found that its stress relief function was insufficient and a gas barrier property after impact test under high temperature and high humidity conditions was considerably deteriorated.

SUMMARY

The present invention has been made in view of the above-described problems and situation. An object of the present invention is to provide an organic electroluminescent element which has a high gas barrier property to water vapor under high temperature and high humidity conditions and excellent in bending resistance and impact resistance. The above-described object of the present invention has been resolved by the following embodiments.

An aspect of the preferred embodiment to achieve an object of the present invention is an organic electroluminescent element comprising: a first gas barrier layer; an intermediate layer; a second gas barrier layer; a third gas barrier layer; a first electrode; an organic functional layer; and a second electrode, in that order, wherein the intermediate layer contains a resin and has a thickness of 10 μm to 250 μm; the second gas barrier layer contains silicon, carbon and oxygen, wherein a composition of silicon, carbon and oxygen contained in the second gas barrier layer is continuously changed in a thickness direction of the second gas barrier layer, and distribution curves of silicon, carbon and oxygen each have an extremum point; and the third gas barrier layer is a polysilazane reforming layer.

BRIEF DESCRIPTION OF THE DRAWINGS

The present invention will be fully understood by the following detailed description and the attached figures. However, the present invention is not limited by them.

DESCRIPTION OF THE PREFERRED EMBODIMENTS

Figure 1A:
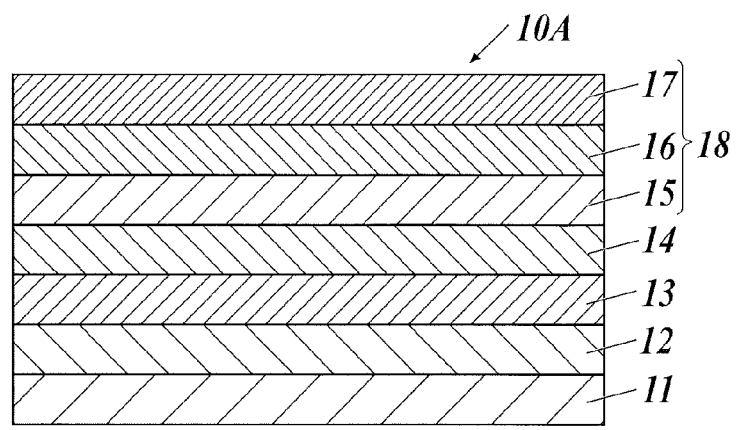
FIG. 1A is a schematic cross-section drawing showing an example of a layer composition of an organic electroluminescent element of the present invention.

An organic electroluminescent element of the present invention comprises: a first gas barrier layer; an intermediate layer; a second barrier layer; a third gas barrier layer; a first electrode; an organic functional layer; and a second electrode, these layers are laminated in that order.

An organic electroluminescent element of the present invention has the following technical properties:
  the intermediate layer contains a resin and has a thickness of 10 μm to 250 μm;
  the second gas barrier layer contains silicon, carbon and oxygen, wherein a composition of silicon, carbon and oxygen contained in the second gas barrier layer is continuously changed in the thickness direction of the layer and distribution curves of silicon, carbon and oxygen each have an extremum point; and
  the third layer is a polysilazane reforming layer.

These technical properties are common or corresponding to the embodiments of the present invention.

Although it is not clearly understood, a formation mechanism and a mode of action of the effects of the present invention are presumed to be as follows.

According to the present invention, it can provide an organic EL element which has a high gas barrier property to water vapor under high temperature and high humidity conditions and excellent in bending resistance and impact resistance.

It is assumed that water penetration in the intermediate layer will be controlled by placing the intermediate layer having a thickness of 10 μm to 250 μm, in addition, the penetrated water will be diffused in the intermediate layer.

Consequently, an environment of the intermediate layer becomes lower humidity condition than the outer environment. As a result, it can be largely decreased a water partial pressure applied to the second gas barrier layer and the third gas barrier layer.

Based on the assumed mechanism as described above, it is believed that an organic EL element of the present invention exhibits a high gas barrier property to water vapor by having an intermediate layer having a layer thickness of 10 μm to 250 μm.

Further, the second gas barrier layer has the following features: a composition of silicon, carbon and oxygen contained in the second gas barrier layer is continuously changed in the thickness direction of the second gas barrier layer; and distribution curves of silicon, carbon and oxygen each have an extremum point.

When the second gas barrier layer has a structure as described above, the stress generated in the state of keeping a bent condition will be absorbed or relieved by the layer structure having a continuous change of the element composition.

It is supposed that, by the above-described mechanism, an organic EL element excellent in stress relief function, bent resistance and impact resistance can be achieved.

One preferable aspect of the embodiments of the present invention is to have a sum of a thickness of the first gas barrier layer and a thickness of the second gas barrier layer being 2,000 nm or less from the viewpoint of improving a gas barrier property.

One preferable aspect of the embodiments of the present invention is to have a sum of a thickness of the first gas barrier layer and a thickness of the second gas barrier layer being 1,000 nm or less, whereby generation of cracks will be controlled.

One preferable aspect of the embodiments of the present invention is to have a third gas barrier layer which is a polysilazane reforming layer and formed by irradiation with vacuum UV (ultraviolet) rays from the viewpoint of exhibiting the effects of the present invention.

One preferable aspect of the embodiments of the present invention is to have an intermediate layer which is adhered to the first gas barrier layer via an adhesive. By this, a close contact of the layers will be improved and it will improve durability.

The present invention and the constitution elements thereof, as well as configurations and embodiments, will be detailed in the following. In the present description, when two figures are used to indicate a range of value before and after "to", these figures are included in the range as a lowest limit value and an upper limit value.

<Constitution Layers of Organic EL Element>

It will be described a specific embodiment of an organic electroluminescent element (hereafter, it is called as an organic EL element) of the present invention.

Figure 1B:
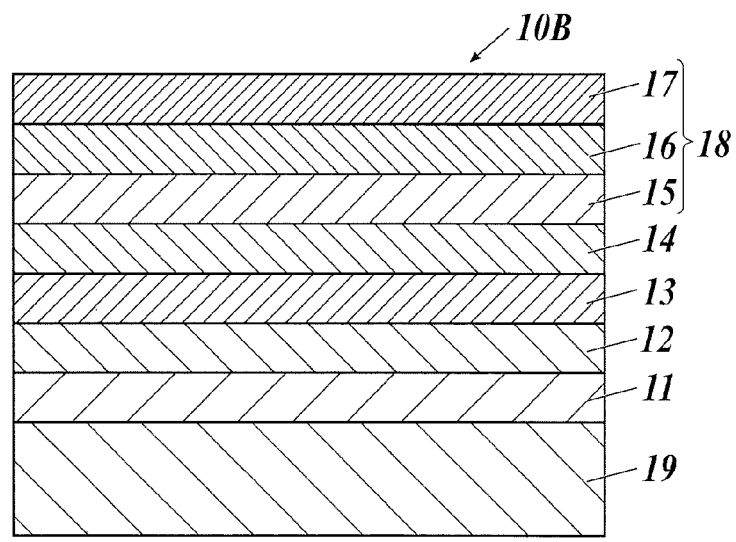
FIG. 1B is a schematic cross-section drawing showing an example of a layer composition of an organic electroluminescent element of the present invention.
Figure 1C:
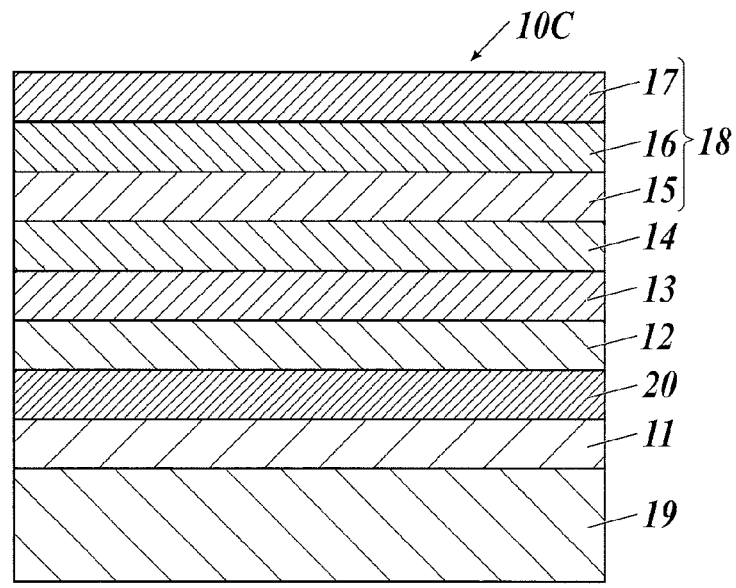
FIG. 1C is a schematic cross-section drawing showing an example of a layer composition of an organic electroluminescent element of the present invention.

FIGS. 1A, 1B and 1C each illustrate a schematic layer composition drawing (cross-section drawing) of organic electroluminescent elements 10A, 10B and 10C of the present invention.

As illustrated in FIG. 1A, an organic EL element 10A comprises: a first gas barrier layer 11, an intermediate layer 12, a second gas barrier layer 13, a third gas barrier layer 14, a first electrode 15, an organic functional layer 16, and a second electrode 17. These layers are laminated in that order. A unit of the first electrode 15, the organic functional layer 16, and the second electrode 17 is called as a light emitting unit 18. In addition, the organic EL element 10A has, as it is called, a bottom emission type constitution in which emission from the organic functional layer 16 is taken out from the side of the first gas barrier layer 11.

As shown in FIG. 1A, an organic EL element 10A is provided with a first gas barrier layer 11 to exhibit a gas barrier property. The first gas barrier layer 11 in the organic EL element 10A has a function of gas barrier, and at the same time, has a function of a substrate in a general meaning.

In addition, the intermediate layer 12 is formed on the first gas barrier layer 11. The intermediate layer 12 contains a resin and a thickness of the intermediate layer is in the range of 10 μm to 250 μm.

Further, the second gas barrier layer 13 is formed on the intermediate layer 12. The second gas barrier layer 13 contains silicon, carbon and oxygen.

Further, the third gas barrier layer 14 is formed on the second gas barrier layer 13. The third gas barrier layer 14 is a polysilazane reforming layer.

The first electrode 15 to become an anode is formed on the third gas barrier layer 14. The organic functional layer 16 containing a light emitting layer and the second electrode 17 to become a cathode are laminated on the first electrode 15.

Among these layers, it is preferable that the first electrode 15 used as an anode is made as a transparent electrode. In this constitution, only the portion in which the organic functional layer 16 is sandwiched between the first electrode 15 and the second electrode 17 will be a light emitting region in the organic EL element 10A.

The second gas barrier layer 13 contains silicon, carbon and oxygen, and composition of silicon, carbon and oxygen contained in the second gas barrier layer 13 is continuously changed in the thickness direction of the layer, and distribution curves of silicon, carbon and oxygen each have an extremum point. When the second gas barrier layer 13 has a structure as described above, the stress generated in the state of keeping a bent condition will be absorbed or relieved by the layer structure having a continuous change of the element composition.

When the layer structure has a uniform element composition in the thickness direction of the layer, it cannot relief the stress within the layer, the stress being generated in the state of keeping a bent condition. As a result, it is likely to produce cracks. In particular, when an organic EL element is held with a large curvature having a radius of curvature of about 2 to 15 mm, generation of cracks or damage in the gas barrier layer is remarkable.

On the other hand, when the second gas barrier layer has a structure in which an element distribution is continuously changed in the thickness direction, and when distribution curves of silicon, carbon and oxygen each have an extremum point, the second gas barrier layer has an effect of a stress relieving layer.

Specifically, the stress generated when the state of bent condition is kept (for example, the stress generated in the second gas barrier layer 13 or at an interface between the second gas barrier layer 13 and other constitution layers, can be absorbed or relieved by the layer structure having a continuous change of the element distribution, and having an extremum point.

As a result, even when an organic EL element is held with a large curvature having a radius of curvature of about 2 to 15 mm, generation of cracks or damage in the gas barrier layer will be prevented.

In addition, generally, when light emission is done by an organic EL element in the state of bent condition, a problem of so-called viewing angle dependency becomes remarkable. This is a shift of chromaticity of emitting light due to distribution property of emitting light. Therefore, in the state of bent condition, there will be produced a problem of decrease of indication quality of an organic EL element or a problem of appearance.

The second has a structure in which an element composition is continuously changed in the thickness direction, and the element distribution has an extremum point. By this feature, it can control interference of light in the specific wavelength range at an interface of the second gas barrier layer.

Consequently, an organic EL element of the present invention enables to improve distribution property of light, and resolve the problem of viewing angle dependency. As a result, uniformity of chromaticity of emitted light from an organic EL element will be improved.

The organic functional layer 16 has a composition of having a light emitting layer to emit light between the electrodes. The electrodes are composed of a first electrode and a second electrode, and each respectively form a cathode and an anode. The light emitting layer contains an organic material having at least a light emitting property. Moreover, the organic functional layer may contain other layer between the light emitting layer and the electrodes.

As shown in FIG. 1B, it may place a substrate 19 in a position adjacent to the first gas barrier layer 11. Otherwise, as shown in FIG. 1C, it is preferable that the first gas barrier layer 11 and the intermediate layer 12 are bonded via an adhesive 20.

In the following, each composition of an organic EL element 10A of the present invention will be described. In organic EL element of the present invention, "transparency" is a property of a light transmittance of 50% or more with light having a wavelength of 550 nm.

[First Gas Barrier Layer]

A first gas barrier layer 11 related to the present invention is not specifically limited as long as it has a gas barrier function.

As a gas barrier function, it is sufficient that a water vapor permeability is 0.01 g/(m2.24 h) or less, more preferably, it is 0.001 g/(m2.24 h) or less.

Examples of a material composing the first gas barrier layer include one or more metal oxide compounds selected from the group consisting of: aluminum oxide, silicon oxide, magnesium oxide, calcium oxide, zirconium oxide and cerium oxide. However, it may be a material having a gas barrier function, and it is not limited to them.

A generally known film forming method may be used for a method of forming first gas barrier layer. Examples thereof are: physical vapor deposition (PVD) methods such as a vacuum vapor deposition method, a sputtering method and an ion plating method; and chemical vapor deposition (CVD).

A thickness of a first gas barrier layer is preferably 1,000 nm or less, more preferably, it is 50 nm to 500 nm, and still more preferably, it is 100 nm to 300 nm from the viewpoint of bending resistance and gas barrier property.

A sum of thickness of a first gas barrier layer and a second gas barrier layer (which will be described later) is preferably 2,000 nm or less, more preferably, it is 100 nm to 1,000 nm, and still more preferably, it is 300 nm to 500 nm from the viewpoint of bending resistance and gas barrier property.

[Intermediate Layer]

As an intermediate layer, it may use a resin having a thickness of 10 μm to 250 μm, in which water that penetrates the first gas barrier layer will be sufficiently diffused. It is preferable that the thickness if 30 μm to 140 μm. By placing an intermediate layer having a thickness of 10 μm or more, water that penetrates the intermediate layer can be controlled, and at the same time, even if water penetrates the intermediate layer, the penetrated water can be diffused in the intermediate layer. By making the thickness of 250 nm or less, it can control cracks or degradation in a bent condition.

A material used for the intermediate layer is not specifically limited as long as it is a transparent resin having flexibility.

Examples of a resin for the intermediate layer include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyarylates and cycloolefin resins such as ARTON (trade name made by JSR Co. Ltd.) and APEL (trade name made by Mitsui Chemicals, Inc.).

A resin formed by curing a photopolymer may be selected. Examples of a photopolymer used for forming an intermediated layer are: a resin composition containing an acrylate compound having a radical reactive unsaturated compound; a resin composition containing an acrylate compound and mercapto compound having a thiol group; and a resin composition dissolved a polyfunctional acrylate monomer such as epoxy acrylate, urethane acrylate, polyester acrylate, polyether acrylate, polyethylene glycol acrylate, and glycerol methacrylate. It is possible to use an arbitral mixture of resin compositions as described above. It is not specifically limited as long as the photopolymer contains a reactive monomer having one or more photopolymerizable unsaturated bond in the molecule.

Examples of a reactive monomer which contains at least one photopolymerizable unsaturated bond in the molecule include: methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethylhexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethylhexyl acrylate, glycerol acrylate, glycidyl acrylate, 2-hydroxyethyl acrylate, 2-hydroxypropyl acrylate, isobornyl acrylate, isodexyl acrylate, iso-octyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexadiol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyltrimethylolpropane diacrylate, pentaerythritol triacrylate, pentaerythritol tetraacrylate, ethylene oxide modified pentaerythritol triacrylate, ethylene oxide modified pentaerythritol tetraacrylate, propylene oxide modified pentaerythritol triacrylate, propylene oxide modified pentaerythritol tetraacrylate, triethylene glycol diacrylate, polyoxypropyltrimethylolpropane triacrylate, butylene glycol diacrylate, 1,2,4-butanediol triacrylate, 2,2,4-trimethyl-1,3-pentadiol diacrylate, diallyl fumarate, 1,10-decanediol dimethyl acrylate, pentaerythritol hexaacrylate, and the compounds in which the above-mentioned acrylate are changed to methacrylate, γ-methacryloxypropyl trimethoxysilane, and 1-vinyl-2-pyrrolidone.

The above-described reactive monomers may be used as a single compound or as a mixture of two or more compounds, or it may be used as a mixture with other compound.

[Second Gas Barrier Layer]

The second gas barrier layer 13 provided on a surface of an intermediate layer 12 contains silicon (Si), carbon (C), and oxygen (O). By the change of an element ratio of silicon, carbon, and oxygen contained in the second gas barrier layer, the second gas barrier layer has a continuous composition change from a surface to a thickness direction. In addition, an element distribution of silicon, carbon, and oxygen contained in the second gas barrier layer has at least one extreme value (extremum) in this continuous composition change in the thickness direction. Namely, the second gas barrier layer has a laminated structure made of a plurality of layers each has a different content of silicon, oxygen and carbon.

It is preferable that the second gas barrier having the composition as described above is provided with the following properties: a water vapor permeability of 1×10-3 g/(m2.24 h) or less (25±0.5° C., and (90±2) % RH) determined based on JIS K 7129-1992; and an oxygen permeability of 1×10-3 ml/(m2·24 h·atm) or less, determined based on JIS K 7126-1987. In addition, a water vapor permeability is preferably 1×10-5 g/(m2·24 h) or less. A thickness of the second gas barrier is preferably 1,000 nm or less form the viewpoint of bending resistance and gas barrier property. More preferably, it is 50 nm to 500 nm, and still more preferably, it is 100 nm to 300 nm.

A method for forming a gas barrier film composing a second barrier layer is not particularly limited. Employable methods include: a vacuum vapor deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, and a coating method. Of these, specifically preferred is a method employing an atmospheric pressure plasma polymerization method described in JP-A 2004-68143.

(Second Gas Barrier Layer: Constitution)

The second gas barrier layer is characterized in having a specific distribution curve of each element, which shows a relationship between the distance in the thickness direction from the surface of the second gas barrier layer and a ratio of atomic amount (an atomic percentage) of the aforesaid silicon, oxygen and carbon.

An atomic percentage of silicon, oxygen or carbon is each represented by a ratio of silicon, oxygen or carbon to a total amount of silicon, oxygen and carbon element: [(Si, O, C)/(Si+O+C)].

A silicon, oxygen or carbon distribution curve represents an atomic percentage of silicon, oxygen or carbon at a distance in the thickness direction from the surface of the second gas barrier layer.

It is preferable that the second gas barrier layer further contains nitrogen, in addition to silicon, oxygen and carbon. By containing nitrogen, a refractive index of the second gas barrier layer will be controlled.

For example, while a refractive index of SiO2 is 1.5, a refractive index of SiN is about 1.8 to 2.0. Therefore, a required refractive index value of 1.6 to 1.8 will be achieved by adding nitrogen to the second gas barrier layer and to form SiON inside of the second gas barrier layer. Thus, a refractive index of the second gas barrier layer will be controlled.

When the second gas barrier layer contains nitrogen, a distribution curve of each element (silicon, oxygen, carbon and nitrogen) which composes the second gas barrier layer will be as follows. Atomic percentages of silicon, oxygen, carbon and nitrogen are represented by a ratio of silicon, oxygen, carbon and nitrogen to a total amount of silicon, oxygen, carbon and nitrogen element: [(Si, O, C, N)/(Si+O+C+N)].

A silicon, oxygen, carbon or nitrogen distribution curve represents an atomic percentage of silicon, oxygen, carbon or nitrogen at a distance in the thickness direction from the surface of the second gas barrier layer.

(Relationship Between a Distribution Curve of Element and a Refractive Index Distribution)

A refractive index distribution of the second gas barrier layer may be controlled by an amount of carbon and an amount of oxygen in the thickness direction of the second gas barrier layer.

Figure 2:
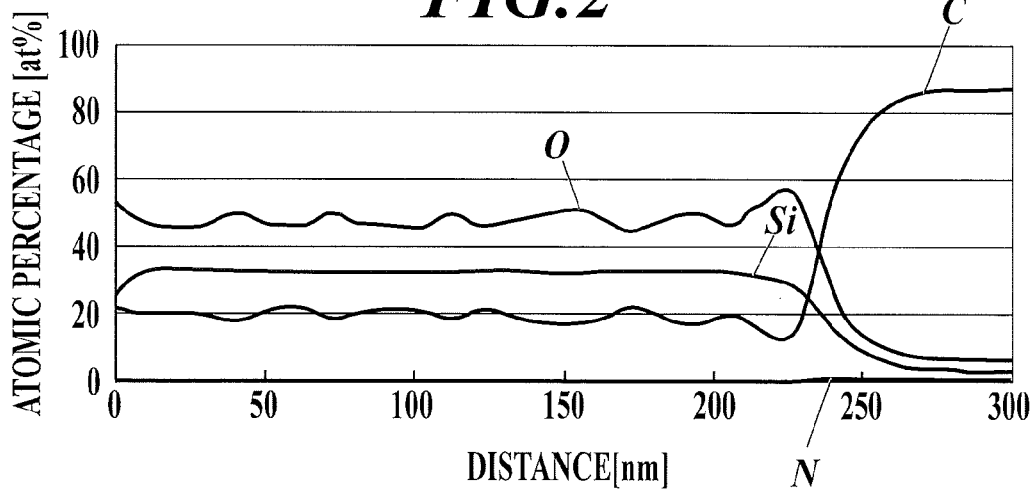
FIG. 2 is a drawing showing a silicon distribution curve, an oxygen distribution curve, a carbon distribution curve and a nitrogen distribution curve.
Figure 3:
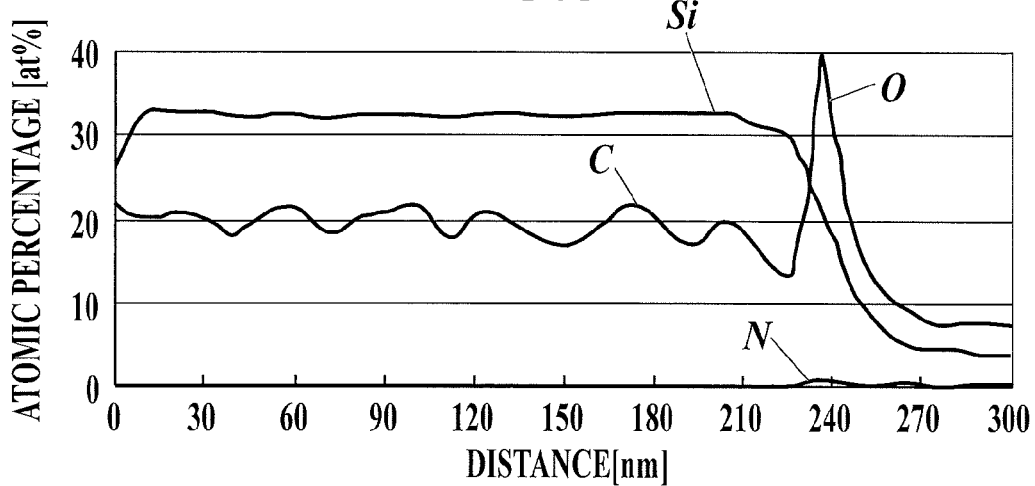
FIG. 3 is a drawing showing an expansion of a carbon distribution curve described in FIG. 2.

FIG. 2 illustrates an example of: silicon, oxygen, carbon and nitrogen distribution curve of the second gas barrier layer. FIG. 3 illustrates an expansion of silicon, oxygen, carbon and nitrogen distribution curves shown in FIG. 2 in the range having a carbon atomic percentage of 0 to 40 at %.

In FIG. 2 and FIG. 3, a horizontal axis indicates a distance (nm) in the thickness direction from the surface of the second gas barrier layer. A vertical axis indicates an atomic percentage (at %) of silicon, oxygen, carbon and nitrogen each to the total amount of silicon, oxygen, carbon and nitrogen.

As illustrated in FIG. 2, an atomic percentage of silicon, oxygen, carbon and nitrogen changes depending on the distance from the surface of the second gas barrier layer. In particular, with respect to oxygen and carbon, an amount of change in an atomic percentage depending on the distance from the surface of the second gas barrier layer is large, and each distribution curve has plural extremum points. An oxygen distribution curve and a carbon distribution curve are mutually correlated. At a distance where an atomic percentage of carbon is large, an atomic percentage of oxygen becomes small, and at a distance where an atomic percentage of carbon is small, an atomic percentage of oxygen becomes large.

Figure 4:
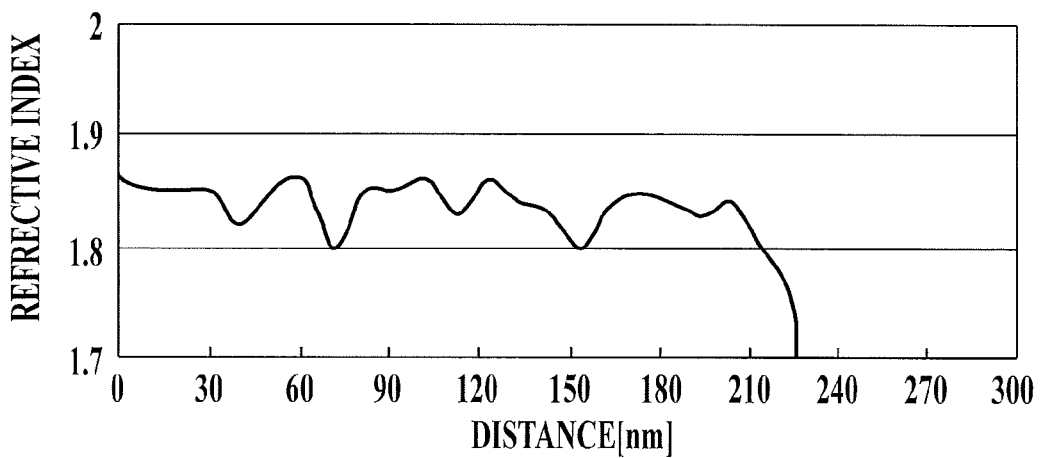
FIG. 4 is a drawing showing a refractive index distribution of a gas barrier layer.

FIG. 4 illustrates a refractive index distribution of the second gas barrier layer. In FIG. 4, a horizontal axis indicates a distance (nm) in the thickness direction from the surface of the second gas barrier layer. A vertical axis indicates a refractive index of the second gas barrier layer.

The refractive index of the second gas barrier layer shown in FIG. 4 is a measured value of the second gas barrier layer with a visible light at a distance in the thickness direction from the surface of the second gas barrier layer.

The measurement of a refractive index of the second gas barrier layer may be done using a known method. For example, Spectro-ellipsometer (ELC-300 made by JASCO Co.) may be used.

As illustrated in FIG. 3 and FIG. 4, there is a mutual relationship between an atomic percentage of carbon and a refractive index of the second gas barrier layer. More specifically, a refractive index of the second gas barrier layer is increased at a point of increasing an atomic percentage of carbon in the second gas barrier layer. Thus, the refractive index of the second gas barrier layer varies in relation to the atomic percentage of carbon in the second gas barrier layer. This means that the refractive index distribution curve of the second gas barrier layer may be controlled by adjusting the atomic percentage of carbon in the thickness direction.

Further, as described above, since an atomic percentage of oxygen and an atomic percentage of carbon are mutually related, the refractive index distribution curve of the second gas barrier layer may be controlled by adjusting the atomic percentage and the distribution curve of oxygen.

Reflection and interference at an interface of a flexible substrate of an organic EL element may be controlled by providing with the second gas bather layer having extremum points in the refractive index curve. As a result, the transmitting light through the organic EL element will be emitted without being affected by total reflection or interference due to the effect of the second gas barrier layer. Therefore, an amount of light will not be decreased, and a taking out efficiency of light from the organic EL element will be improved.

When a metal transparent conductive layer containing silver is used as a first electrode 15, the transmitting light through the organic EL element is likely to be affected by reflection and interference at the first electrode 15 to result in generating a problem of viewing angel dependency. This is considered to be produced by the following. A component of light having a specific wavelength range is reflected at an aggregated metal in the metal transparent conductive layer, at the metal transparent conductive layer or at the interface thereof. This reflected light will interfere with a light emission spectrum to result in changing the light emission spectrum to give viewing angel dependency.

Therefore, the viewing angel dependency may be controlled by adjusting the refractive index distribution curve of the second gas barrier layer in such a manner of not interfering with light having a specific wavelength. The refractive index distribution curve of the second gas barrier layer may be managed by an atomic percentage of carbon. Consequently, it can give a required optical property to the second gas barrier layer by controlling a carbon distribution curve.

In the organic EL element of the present invention, it can adjust a light spectrum by the presence of one or a plurality of extremum points in the refractive index distribution curve of the second gas barrier layer. Consequently, interference conditions of the organic EL element will be dispersed to lead to a constitution in which there occurs no interference at a specific wavelength. Therefore, the distribution of the transmitted light through the organic EL element 1 may be controlled by the second gas barrier layer. By solving the problem of the viewing angel dependency of the light spectrum, it can achieve a uniform light distribution of the organic EL element.

(Conditions of Distribution Curve of Each Element)

It is preferable that atomic percentages of silicon, oxygen and carbon, and distribution curves of each element in the second gas barrier layer will satisfy the following conditions (i) to (iii).

(i) The atomic percentages of silicon, oxygen, and carbon satisfy the relationship (1) indicated below in an area covering 90% or more of the distance from the surface across the thickness of the second gas barrier layer:

(Atomic percentage of oxygen)>(atomic percentage of silicon)>(atomic percentage of carbon)   (1)

Otherwise, the atomic percentages of silicon, oxygen, and carbon satisfy the relationship (2) indicated below in an area covering 90% or more of the distance from the surface across the thickness of the second gas barrier layer:

(Atomic percentage of carbon)>(atomic percentage of silicon)>(atomic percentage of oxygen)   (2)

(ii) The carbon distribution curve has at least one local maximum point and one local minimum point.

(iii) The absolute value of the difference between the maximum value and the minimum value of the atomic percentage of carbon in the carbon distribution curve is 5 at % or more.

It is preferable that an organic EL element of the present invention is provided with a second gas barrier layer satisfying at least one of the above-described conditions (i) to (iii). In particular, it is preferable that the organic EL element is provided with a second gas barrier layer satisfying all of the above-described conditions (i) to (iii).

In addition, the organic EL element may be provided with two or more second gas barrier layers satisfying all of the above-described conditions (i) to (iii). When the organic EL element is provided with two or more second gas barrier layers, the material of the thin layer in the plural second gas barrier layers may be the same or different.

The refractive index of the second gas barrier layer may be regulated by an atomic percentage of silicon, carbon or oxygen as described above. Consequently, the refractive index of the second gas barrier layer may be adjusted to the required range by the above-described conditions (i) to (iii).

(Carbon Distribution Curve)

The second gas barrier layer is required to have a carbon distribution curve containing at least one extremum point. More preferably, the second gas barrier layer has a carbon distribution curve containing at least two extremum points. In particular, still more preferably, a carbon distribution curve contains at least three extremum points. Further, it is preferable that the carbon distribution curve contains at least one local maximum point and one local minimum point.

When the carbon distribution curve contains an extremum point, the light distribution of the obtained second gas barrier layer will be improved. As a result, it may solve the problem of the viewing angle dependency of the emitted light from the organic EL element obtained through the first electrode 15.

When the second gas barrier layer contains three or more extremum points, it is preferable that the distance between one extremum point and an adjacent extremum point in the carbon distribution curve is 200 nm or less in the thickness direction from the surface of the second gas barrier layer. More preferably, it is 100 nm or less.

(Extremum)

Extremum points in the atomic distribution curve of the second gas barrier layer refer to measured values of local maximum points or local minimum points of the atomic percentage of each element at a certain distance from the surface of the second gas barrier layer in the thickness direction of the second gas barrier layer. Otherwise, they are measured values of a refractive index distribution curve corresponding to these values.

The local maximum point in the distribution curve of each element of the second gas barrier layer represents a point at which the atomic percentage of the element changes from an increase to a decrease when the distance from the surface of the second gas barrier layer varies, and from which point the atomic percentage of the element decreases by 3 at % or more when the distance from the surface of the second gas barrier layer in the thickness direction varies by 20 nm On the other hand, the local minimum point in the distribution curve of each element of the second gas barrier layer represents a point at which the atomic percentage changes from a decrease to an increase when the distance from the surface of the second gas barrier layer varies, and from which point the atomic percentage of the element increases by 3 at % or more when the distance from the surface of the second gas barrier layer in the thickness direction varies by 20 nm.

In a carbon distribution curve of the second gas barrier layer, it is preferable that an absolute value of the difference between the maximum value and the minimum value of the atomic percentage of carbon is 5 at % or more. In the second gas barrier layer, it is more preferable that an absolute value of the difference between the maximum value and the minimum value of the atomic percentage of carbon is 6 at % or more. And still more preferably, it is 7 at % or more. When the difference between the maximum value and the minimum value of the atomic percentage of carbon is in the above-described range, the difference of refractive index in a refractive index distribution curve of the obtained second gas barrier layer becomes large, and light distribution will be further improved.

There is correlation between a carbon distribution amount and a refractive index. When the absolute value of the difference between the maximum value and the minimum value of carbon is 7 at % or more, it is known that the obtained absolute value of the difference between the maximum value and the minimum value of refractive index becomes 0.2 or more.

(Oxygen Distribution Curve)

It is preferable that the second gas barrier layer has an oxygen distribution curve containing at least one extremum point. More preferably, the second gas barrier layer has an oxygen distribution curve containing at least two extremum points. In particular, still more preferably, an oxygen distribution curve contains at least three extremum points. Further, it is preferable that the oxygen distribution curve contains at least one local maximum point and one local minimum point.

When the oxygen distribution curve contains an extremum point, the light distribution of the obtained second gas barrier layer will be improved. As a result, it may solve the problem of the viewing angle dependency of the emitted light from the organic EL element obtained through the first electrode.

When the oxygen distribution curve contains three or more extremum points, it is preferable that the distance between one extremum point and an adjacent extremum point in the carbon distribution curve is 200 nm or less in the thickness direction from the surface of the second gas barrier layer. More preferably, it is 100 nm or less from the viewpoint of improving the light distribution and releasing the stress in the second gas barrier layer.

In an oxygen distribution curve of the second gas barrier layer, it is preferable that an absolute value of the difference between the maximum value and the minimum value of the atomic percentage of oxygen is 5 at % or more. In the second gas barrier layer, it is more preferable that an absolute value of the difference between the maximum value and the minimum value of the atomic percentage of oxygen is 6 at % or more. And still more preferably, it is 7 at % or more. When the difference between the maximum value and the minimum value of the atomic percentage of oxygen is in the above-described range, the light distribution will be improved based on the refractive index distribution curve of the obtained second gas barrier layer.

(Silicon Distribution Curve)

In a silicon distribution curve of the second gas barrier layer, it is preferable that an absolute value of the difference between the maximum value and the minimum value of the atomic percentage of silicon is less than 5 at %. More preferably, an absolute value of the difference between the maximum value and the minimum value of the atomic percentage of silicon is less than 4 at %. Still more preferably, it is less than 3 at %. When the difference between the maximum value and the minimum value of the atomic percentage of silicon is in the above-described ranges, a higher light distribution can be obtained based on the refractive index distribution curve of the obtained second gas barrier layer.

(Sum of Oxygen and Carbon: Oxygen-Carbon Distribution Curve)

In the second gas barrier layer, a percentage of a sum of oxygen and carbon with respect to a sum of silicon, oxygen and carbon is called as "an oxygen-carbon distribution curve".

In an oxygen-carbon distribution curve of the second gas barrier layer, it is preferable that an absolute value of the difference between the maximum value and the minimum value of the atomic percentage of the sum of oxygen and carbon is less than 5 at %. More preferably, it is less than 4 at %. Still more preferably, it is less than 3 at %. When the difference between the maximum value and the minimum value of the atomic percentage of the sum of oxygen and carbon is in the above-described ranges, a higher light distribution can be obtained based on the refractive index distribution curve of the obtained second gas bather layer.

(XPS Depth Profiling)

The above-described silicon, oxygen, carbon, oxygen-carbon, and nitrogen distribution curves will be prepared through XPS depth profiling in which the interior of the specimen is exposed in sequence for analysis of the surface composition through a combination of X-ray photoelectron spectroscopy (XPS) and ion-beam sputtering using a rare gas, such as argon.

Each distribution curve acquired through such XPS depth profiling has, for example, a vertical axis representing the atomic percentage (unit: at %) of the element and a horizontal axis representing the etching time (sputtering time).

In a distribution curve of an element having an etching time as a horizontal axis, the etching time correlates approximately with the distance from the surface of the second gas barrier layer in the thickness direction of the gas barrier layer. Thus, a distance from the surface of the second gas barrier layer calculated on the basis of the relationship between the etching rate and etching time used in the XPS depth profiling may be adopted "as a distance from the surface of the second gas barrier layer in the thickness direction".

For the XPS depth profiling, it is preferable to select an ion-beam sputtering of a rare gas using argon (Ar+) as an ionic species and an etching rate of 0.05 nm/sec (equivalent to a value for a thermally-oxidized SiO2 film).

From the viewpoint of forming a gas barrier layer having a uniform layer and superior light distribution property, it is preferable that the second gas barrier layer is substantially uniform in the direction of the film surface (the direction parallel to the surface of the second gas barrier layer).

In this specification, a second gas barrier layer being substantially uniform in the direction of the film surface means the following. At any two points of the second gas barrier layer, the element distribution curves for the two points contain the same number of extremum points, and the absolute values of the differences between the maximum value and the minimum value of the atomic percentage of carbon in the carbon distribution curves are identical or have a difference of 5 at % or less.

(Substantial Continuity)

In the second gas barrier layer, the carbon distribution curve preferably has substantial continuity. In this specification, the carbon distribution curve having substantial continuity means that the variation in the atomic percentage of carbon in the carbon distribution curve does not include any discontinuity. Specifically, it means that the condition represented by the following mathematical expression (F1) is satisfied, F1 being the relationship between the distance x (in nm) from the surface of the second gas barrier layer in the thickness direction, which is derived from the etching rate and the etching time, and the atomic percentage of carbon (C in at %):

$(dC/dx) \leq 0.5$ \hfill (F1).

(Atomic Percentage of Silicon Atom, Oxygen Atom and Carbon Atom)

In the silicon, oxygen, and carbon distribution curves, it is preferable that atomic percentages of silicon, oxygen, and carbon will satisfy the condition represented by the relationship (1) in an area corresponding to 90% or more of the thickness of the second gas barrier layer.

(Atomic percentage of oxygen)>(atomic percentage of silicon)>(atomic percentage of carbon) \hfill (1)

In this case, the atomic percentage of silicon atom to the total amount of silicon atom, oxygen atom and carbon atom in the second gas barrier layer is preferably in the range of 25 to 45 at %, more preferably in the range of 30 to 40 at % from the viewpoint of improving gas barrier properties.

The atomic percentage of oxygen atom to the total amount of silicon atom, oxygen atom and carbon atom in the second gas barrier layer is preferably in the range of 33 to 67 at %, more preferably in the range of 45 to 67 at % from the viewpoint of improving gas barrier properties and transparency.

The atomic percentage of carbon atom to the total amount of silicon atom, oxygen atom and carbon atom in the second gas barrier layer is preferably in the range of 3 to 33 at %, more preferably in the range of 3 to 25 at % from the viewpoint of improving gas bather properties and transparency.

[Third Gas Barrier Layer]

A third gas barrier layer 14 is placed between a second barrier layer 13 and a first electrode 15. It is placed for the purpose of preventing separation at an interface between the second barrier layer 13 and the first electrode 15 when an organic EL element 10A is bent.

By placing the third gas barrier layer 14, the rough surface of the second barrier layer 13 may be smoothed, and unevenness or pinholes produced on the second barrier layer 13 may be buried to produce a smooth surface.

As a third gas barrier layer 14 as described above, it is preferable to use: a polysilazane reforming layer which is formed by performing a reforming treatment to a layer containing polysilazane by irradiation with active energy rays; or other reforming layer which is formed by performing a predetermined reforming treatment to an organic or inorganic layer.

(Polysilazane Reforming Layer)

A polysilazane reforming layer is preferably formed by: applying a coating solution containing polysilazane and drying; then, carrying out reforming treatment by irradiating the coated layer with an active energy radiation.

The polysilazane reforming layer forms a surface region in which reforming of polysilazane is more advanced, and there is formed a less reformed region or unreformed region at the lower portion of this region. In the present invention, "a polysilazane reforming layer" includes the less reformed region and unreformed region.

"Polysilazane" is a polymer having a silicon-nitrogen bond and it is a ceramic precursor inorganic polymer such as: SiO2, Si3N4 and an intermediate solid solution of SiOxNy containing Si—N, Si—H and N—H bonds in the molecule. Specifically, preferable polysilazane has the following structure.

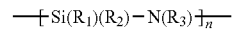

Formula (I)

In the aforesaid Formula (I), R1, R2 and R3 each independently represent a hydrogen atom, a substituted or unsubstituted alkyl group, aryl group, vinyl group or (trialkoxysilyl)alkyl group. R1, R2 and R3 each may be the same or different with each other.

Here, as an alkyl group, there are cited a straight, branched or cyclic alkyl group with 1 to 8 carbon atoms. More specifically, examples of an alkyl group include: a methyl group, an ethyl group, an n-propyl group, an isopropyl group, an n-butyl group, an isobutyl group, a sec-butyl group, a tert-butyl group, an n-pentyl group, an isopentyl group, a neopentyl group, an n-hexyl group, an n-heptyl group, an n-octyl group, a 2-ethylhexyl group, a cyclopropyl group, a cyclopentyl group, and a cyclohexyl group.

As an aryl group, there are cited aryl groups having 6 to 30 carbon atoms. More specifically, there are cited: non-condensed hydrocarbon groups such as a phenyl group, a biphenyl group and a terphenyl group;

condensed polycyclic hydrocarbon groups such as a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranthenyl group, an acephenanthrylenyl group, an aceanthrylenyl group, a triphenylenyl group, a pyrenyl group, a chrysenyl group and a naphthacenyl group.

As a (trialkoxysilyl)alkyl group, there are cited an alkyl group of 1 to 8 carbon atoms having a silyl group substituted with an alkoxyl group of 1 to 8 carbon atoms. More specifically, it may be cited: 3-(triethoxysilyl) propyl group and 3-(trimethoxysilyl)propyl group.

A substituent which may be present in the aforesaid R1 to R3 is not specifically limited. Examples thereof are: an alkyl group, a halogen atom, a hydroxyl group (—OH), a mercapto group (—SH), a cyano group (—CN), a sulfo group (—SO3H), a carboxyl group (—COOH), and a nitro group (—NO2).

In addition, a substituent which may be present will not be the same as R1 to R3 which are substituted. This means that, for example, when R1 to R3 each are an alkyl group, these are not further substituted with an alkyl group.

Among them, it is preferable that R1, R2 and R3 each are: a hydrogen atom, a methyl group, an ethyl group, a propyl group, an isopropyl group, a butyl group, an isobutyl group, a tert-butyl group, a phenyl group, a vinyl group, a 3-(triethoxysilyl)propyl group, and 3-(trimethoxysilylpropyl) group.

In the aforesaid Formula (I), n is an integer, and it is preferable that n is determined so that polysilazane having a structure represented by Formula (I) will have a number average molecular weight of 150 to 150,000 g/mol.

Among compounds having a structure represented by the aforesaid Formula (I), one of the preferable embodiments is "perhydropolysilazane" in which all of R1, R2 and R3 are a hydrogen atom.

Preferable polysilazane has a structure represented by the following Formula (II).

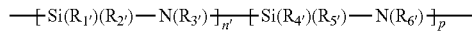

Formula (II)

In the aforesaid Formula (II), R1', R2', R3', R4', R5', and R6' each independently represent a hydrogen atom, a substituted or unsubstituted alkyl group, aryl group, vinyl group or (trialkoxysilyl)alkyl group. R1', R2', R3', R4', R5', and R6' each may be the same or different with each other. The aforesaid substituted or unsubstituted alkyl group, aryl group, vinyl group or (trialkoxysilyl)alkyl group each have the same definition as described for the aforesaid Formula (I), therefore, the explanation to them is omitted.

In the aforesaid Formula (II), n' and p each are an integer, and it is preferable that n' and p are determined so that polysilazane having a structure represented by Formula (II) will have a number average molecular weight of 150 to 150,000 g/mol.

Further, n' and p may be the same or different.

Among polysilazane compounds represented by Formula (II), the following are preferable: a compound in which R1', R3', and R6' each represent a hydrogen atom, and R2', R4', and R5' each represent a methyl group; a compound in which R1', R3', and R6' each represent a hydrogen atom, R2' and R4' each represent a methyl group, and R5' represents a vinyl group; and a compound in which R1', R3', R4', and R6' each represent a hydrogen atom, and R2' and R5' each represent a methyl group.

Preferable polysilazane has a structure represented by the following Formula (III).

In the aforesaid Formula (III), R1", R2", R3", R4", R5", R6", R7", R8", and R9" each independently represent a hydrogen atom, a substituted or unsubstituted alkyl group, aryl group, vinyl group or (trialkoxysilyl)alkyl group. R1", R2", R3", R4", R5", R6", R7", R8", and R9" each may be the same or different with each other. The aforesaid substituted or unsubstituted alkyl group, aryl group, vinyl group or (trialkoxysilyl)alkyl group each have the same definition as described for the aforesaid Formula (I), therefore, the explanation to them is omitted.

In the aforesaid Formula (III), n", p" and q each are an integer, and it is preferable that n", p" and q are determined so that polysilazane having a structure represented by Formula (III) will have a number average molecular weight of 150 to 150,000 g/mol.

Further, n", p" and q may be the same or different.

Among polysilazane compounds represented by Formula (III), a preferable is a compound in which R1", R3", and R6" each represent a hydrogen atom, R2", R4", R5" and R8" each represent a methyl group, R9" represents a (trialkoxysilyl)alkyl group, and R7" represents an alkyl group or a hydrogen atom.

On the other hand, an organopolysilazane, which has a structure of substituting a part of hydrogen atoms bonded to Si with an alkyl group, will improve adhesiveness with the underlying substrate by having an alkyl group such as a methyl group. And it can give tenacity to a ceramic film made of stiff and breakable polysilazane. It has a merit of decreased generation of crack even when the (average) film thickness is increased. According to an application, one of these perhydropolysilazane and organopolysilazane may be selected and they may be used in combination.

Perhydropolysilazane is presumed to have a ring structure containing a straight chain, and a ring structure mainly composed of a 6- and a 8-membered ring. Its molecular weight is about 600 to 2,000 (in polystyrene conversion value) in a number average molecular weight (Mn). It has a material of liquid and solid, and the state depends on the molecular weight.

Polysilazane is commercially available in a solution state dissolved in an organic solvent. A commercially available product may be used directly as a coating liquid for producing a polysilazane reforming layer.

Examples of commercially available polysilazane are: AQUAMICA™ NN120-10, NN120-20, NAX120-20, NN110, NN310, NN320, NL110A, NL120A, NL120-20, NL150A, NP110, NP140, and SP140, which are supplied by AZ Electronic Materials, Ltd.

Although another examples of polysilazane are not specifically limited, examples of polysilazane which may be converted to ceramic at a low temperature are: silyl alkoxide added polysilazane, being produced by reacting silyl alkoxide with the above-described polysilazane (for example, refer to JP-A 5-238827); glycidol added polysilazane, being produced by reacting glycidol (for example, refer to JP-A 6-122852); alcohol added polysilazane, being produced by reacting alcohol (for example, refer to JP-A 6-240208); metal carboxylic acid salt added polysilazane, being produced by reacting metal carboxylate (for example, refer to JP-A 6-299118); acetyl acetonate complex added polysila-

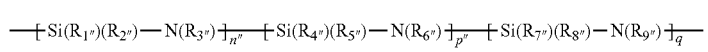

Formula (III)

zane, being produced by reacting acetyl acetonate complex containing a metal (for example, refer to JP-A 6-306329); and metal fine particle added polysilazane, being produced by adding metal fine particles (for example, refer to JP-A 7-196986).

When polysilazane is used, the content of polysilazane in the polysilazane layer before subjecting to a reforming treatment may be made to be 100 mass %, in which the total mass of the polysilazane reforming layer is set to be 100 mass %.

Further, when a polysilazane reforming layer contains other compound than polysilazane, it is preferable that the content of polysilazane in the layer is in the range of 10 to 99 mass %, more preferably, it is in the range of 40 to 95 mass %, and still more preferably, it is in the range of 70 to 95 mass %.

A forming method of a polysilazane reforming layer by a coating method is not specifically limited, and known methods may be adopted. It is preferable that a coating solution containing polysilazane with a catalyst when required in an organic solvent for forming a polysilazane reforming layer is applied with a known wet coating method, and a reforming treatment is performed after removing the solvent with evaporation.

(Coating Solution for Forming a Polysilazane Reforming Layer)

As a solvent to prepare a coating solution for forming a polysilazane reforming layer, it is not specifically limited as long as it can dissolve polysilazane.

Preferable are solvents without containing water or a reactive group (for example, a hydroxyl group, or an amino group), which easily react with polysilazane. It is preferable to use an unreactive organic solvent. In particular, aprotic organic solvent is more preferable.

Specific examples of an aprotic solvent are as follows: an aliphatic hydrocarbon, an alicyclic hydrocarbon and an aromatic hydrocarbon such as pentane, hexane, cyclohexane, toluene, xylene, Solvesso™, and turpentine; a halogenated hydrocarbon solvent such as methylene chloride and trichloroethane; an ester such as ethyl acetate and butyl acetate; a ketone such as acetone and methyl ethyl ketone; an aliphatic ether such as dibutyl ether; an alicyclic ether such as dioxane and tetrahydrofuran; and mono and polyalkylene glycol dialkyl ethers (such as diglyme). These organic solvents may be chosen in accordance with characteristics, such as solubility of silicon compound, and an evaporation rate of a solvent, and a plurality of solvents may be mixed.

A concentration of polysilazane in a coating solution for forming a polysilazane reforming layer is not specifically limited. Although it depends on a layer thickness and a pot life, it is preferably in the range of 1 to 80 mass %, more preferably, it is in the range of 5 to 50 mass %, and still more preferably, it is in the range of 10 to 40 mass %.

A coating solution for forming a polysilazane reforming layer preferably contains a catalyst in order to accelerate reforming.

Examples of a catalyst include: amine compounds such as N,N-diethylethanolamine, N,N-dimethylethanolamine, triethanolamine, triethylamine, 3-morpholino-propylamine, N,N,N',N'-tetramethyl-1,3-diaminopropane, and N,N,N',N'-tetramethyl-1,6-diaminohexane; metal complexes of a Pt compound such as Pt acetyl acetonate, a Pd compound such as Pd propionate, and a Rh compound such as Rh acetyl acetonate; N-heterocyclic compounds of pyridine derivatives such as pyridine, α-picoline, β-picoline, γ-picoline, piperidine, lutidine, pyrimidine, and pyridazine; DBU (1,8-diazabicyclo[5.4.0]-7-undecene), DBN (1,5-diazabicyclo[4.3.0]-5-nonene); organic acids such as acetic acid, propionic acid, butyric acid, valeric acid, maleic acid, stearic acid; inorganic acids such as hydrochloric acid, nitric acid, sulfuric acid, and hydrogen peroxide. Among them, it is preferable to use an amine compound.

As a concentration of a catalyst added, it is preferably in the range of 0.1 to 10 mass %, more preferably, it is in the range of 0.5 to 7 mass % based on the mass of polysilazane.

By making the concentration of a catalyst in this range, it is possible to avoid excessive formation of silanol due to a rapid advance in reaction, decrease of a layer density and increase of layer defects.

A coating solution for forming a polysilazane reforming layer may contain an additive as described below when needed.

Examples thereof are: cellulose ethers, cellulose esters such as ethyl cellulose, nitro cellulose, cellulose acetate, and cellulose acetobutylate; natural resins such as rubber and a rosin resin; synthetic resins such as a polymerized resin; condensed resins such as aminoplast, specifically a urea resin, a melamine-formaldehyde resin, an alkyd resin, an acrylic resin, a polyester or a modified polyester, epoxide, polyisocyanate or blocked polyisocyanate, and polysiloxane.

(Method for Applying a Coating Solution for Forming a Polysilazane Reforming Layer)

A conventionally known appropriate wet coating method, may be adopted as a coating method of a coating solution for forming a polysilazane reforming layer. Specific examples of a coating method include: a spin coat method, a roll coat method, a flow coat method, an inkjet method, a spray coat method, a printing method, a dip coat method, a casting film forming method, a bar coat method and a gravure printing method.

A coating thickness may be appropriately set up according to the purpose. For example, a coating thickness per one polysilazane reforming layer may be set up so that the thickness after being dried is preferably about 10 nm to 10 μm, more preferably, it is in the range of 15 nm to 1 μm, still more preferably, it is in the range of 20 nm to 500 nm.

When the thickness is 10 nm or more, a sufficient gas barrier property will be obtained, and when the thickness is 10 μm or less, stable coating will be achieved during layer formation and high light transparency will be realized.

After applying the coating solution, it is preferable that the coated layer is dried. An organic solvent contained in the coating solution will be removed by drying the coated layer. Here, the organic solvent contained in the coating solution may be removed completely, or the organic solvent may be remained partially.

A suitable polysilazane reforming layer may be formed even when the organic solvent remains partially. When it remains in the layer, it will be removed later.

Although a drying temperature of the coated layer depends on the substrate used, it is preferable in the range of 50 to 200° C. For example, when a polyethylene terephthalate substrate having a glass transposition temperature (Tg) of 70° C. is used, it is preferable to set a drying temperature to 150° C. or less by considering heat deformation of the substrate.

The above-described temperature may be set up by using a hot plate, an oven or a furnace. It is preferable that the drying time is set up to be a short time. For example, when the drying temperature is 150° C., it is preferable that the drying time is set up to be 30 minutes or less. Further, a drying atmosphere may be any one of the conditions of under air, under nitrogen, under argon, under vacuum and under controlled reduced oxygen density.

A method for a coated layer obtained by applying a coating solution for forming a polysilazane reforming layer may contain a step of removing water before performing a reforming treatment or during a reforming treatment. As a step of removing water, it is preferable to dehumidify with keeping a low humidity condition. The humidity under a low humidity condition will change depending on a temperature. The preferable embodiment is indicated by fixing a dew point containing a relation of temperature and humidity.

A preferable dew point is 4° C. or less (temperature of 25° C. and humidity of 25%). A more preferable dew point is −5° C. or less (temperature of 25° C. and humidity of 10%), and preferably, the keeping time is suitably determined on the thickness of the polysilazane reforming layer.

When the thickness of the polysilazane reforming layer is 1.0 μm or less, a preferable dew point is −5° C. or less and a preferable keeping time is 1 minute or less.

In addition, although a lowest limit of a dew point is not specifically limited, usually, it is −50° C. or more, and preferably, it is −40° C. or more. Removing water before performing a reforming treatment or during a reforming treatment is a preferable embodiment from the viewpoint of accelerating dehydration reaction of a polysilazane reforming layer which has been converted to silanol.

(Reforming Treatment of a Polysilazane Coated Layer Formed by a Coating Method)

A reforming treatment of a polysilazane coated layer formed by a coating method indicates a conversion reaction of polysilazane into silicon oxide or silicon oxynitride. More specifically, it is a treatment in which a polysilazane coated later is reformed into an inorganic layer which exhibits a gas barrier property.

The conversion reaction of polysilazane into silicon oxide or silicon oxynitride may be done by a suitably adopted known method.

As a reforming treatment, preferable are conversion reactions of a plasma treatment and a UV ray irradiation treatment enabling to achieve a conversion reaction at a relatively low temperature from the viewpoint of application to a resin film substrate.

(Plasma Treatment)

An atmospheric pressure plasma CVD method, which performs a plasma CVD process near the atmospheric pressure, does not require a reduced pressure in contrast with a vacuum plasma CVD method. Not only its production efficiency is high, but its film forming speed is high since a plasma density is high. Further, compared with a condition of a conventional CVD method, since an average free path of a gas is very short under a high-pressure of an atmospheric pressure, it can obtain an extremely homogeneous film.

When an atmospheric pressure plasma treatment is carried out, it is used a nitrogen gas or elements of group 18 in the periodic table as a discharge gas. Specifically, it is used: helium, neon, argon, krypton, xenon or radon. Of these, nitrogen, helium and argon are preferably used, and, specifically, nitrogen is most preferably used in view of the low cost.

(UV Ray Irradiation Treatment)

A treatment by irradiation with UV rays is preferable as a reforming treatment. Ozone and active oxygen, which are produced by UV rays (the same meaning as UV light), have a high oxidation ability. Therefore, it can form silicon oxide or silicon oxynitride, each having a high density and high insulating ability, at a low temperature.

By this UV ray irradiation, the substrate will be heated, O2 and H2O, a UV absorbing agent and polysilazane itself, which contribute to convert to ceramic (silica conversion), will be exited and activated. As a result, polysilazane becomes exited, and conversion of polysilazane into ceramics will be promoted. Moreover, an obtained polysilazane reforming layer will become denser.

The UV ray irradiation may be done at any moment after formation of a coated layer. For a UV ray irradiation treatment, it may be used any conventionally used UV ray generating apparatus. In general, although a UV ray is an electromagnetic wave having a wavelength of 10 nm to 400 nm, it is preferable that a UV ray having 210 nm to 375 nm is used as a UV ray irradiation treatment except for a vacuum UV ray (10 nm to 200 nm) treatment.

When irradiating with UV rays, it is preferable that irradiation strength and irradiating time are set up within the range in which the substrate supporting a polysilazane layer to be reformed does not get damage.

When a plastic film is used as a substrate, as in the case of organic EL elements 10B and 10C, an example of an irradiation treatment is as follows: using a lamp of 2 kW (80 W/cm×25 cm); adjusting the distance between the substrate and the UV irradiation lamp so that the strength at the substrate surface becomes to be 20 to 300 mW/cm2, preferably to be 50 to 200 mW/cm2; and irradiation is preferably done for 0.1 second to 10 minutes.

In general, in the case of a plastic film, when the temperature of a substrate is 150° C. or more during the UV irradiation treatment, a property of the substrate will be damaged to result in deformation of the substrate or deterioration of its strength.

However, in the case of a highly thermal resistive film such as polyimide, it is possible to carry out a reforming treatment at a higher temperature. Consequently, as a temperature of a substrate during a UV ray irradiation treatment, there is no general upper limit. It can suitably set up by one skilled in the art according to the kind of substrate.

Examples of an apparatus to generate UV rays include: a metal halide lamp, a high pressure mercury lamp, a low pressure mercury lamp, a xenon arc lamp, a carbon arc lamp, an excimer lamp (a single wavelength of 172 nm, 222 nm, or 308 nm, for example, manufactured by Ushio Inc., M. D. COM. Inc.), and a UV light laser. However, the present invention is not limited to them.

When the generated UV rays are irradiated to a polysilazane reforming layer, it is preferable that irradiation of the generated UV rays to the polysilazane reforming layer is done after making reflex with a reflex plate from the viewpoint of achieving improved efficiency and uniform irradiation.

The UV ray irradiation may be applicable to a batch treatment and a continuous treatment. It may be suitably selected according to a shape of a substrate used. For example, in the case of a batch treatment, a laminated body having a polysilazane reforming layer on the surface thereof may be treated in a UV ray furnace which is provided with a UV ray generating source. A UV ray furnace itself is generally known, and it can use a UV ray furnace made by Eye Graphics Co. Ltd.

Further, when a laminated body having a polysilazane reforming layer on the surface thereof is an elongated film, making ceramic will be done by continuously irradiating with UV rays in a drying zone provided with the aforesaid UV ray generating source while conveying this elongated film.

The time required for UV ray irradiation depends on the used substrate, the composition and the density of the polysilazane reforming layer. It is generally, 0.1 second to 10 minutes, and preferably, it is 0.5 seconds to 3 minutes.

(Vacuum UV Ray Irradiation Treatment: Excimer Irradiation Treatment)

To a polysilazane reforming layer, one of the most preferable reforming treatments is a treatment by irradiation with vacuum UV rays (excimer irradiation treatment).

A treatment by irradiation with vacuum UV rays uses a light energy of wavelength of 100 nm to 200 nm, preferably, a light energy of wavelength of 100 nm to 180 nm. This energy is larger than an atomic binding force in a polysilazane compound. By using this light energy, it is possible to make advance an oxidation reaction with active oxygen or ozone while directly breaking an atomic bond only with an effect of a photon, which is called as a photo quantum process. As a result, formation of silicon oxide layer will be achieved at a relatively low temperature (about 200° C. or less).

In addition, when carrying out an excimer irradiation treatment, it is preferable to use a thermal treatment in combination as described above. The detailed thermal conditions are as described above.

The radiation source is only required to emit light having a wavelength of 100 nm to 180 nm. Suitable light sources are: an excimer radiator (for example, Xe excimer lamp) having a maximum radiation at 172 nm; a low pressure mercury lamp having a bright line at 185 nm; a medium pressure and a high pressure mercury lamp having a component of a wavelength of 230 nm or less; and an excimer lamp having a maximum radiation at 222 nm.

Among them, since a Xe excimer lamp emits ultraviolet rays of a single short wavelength of 172 nm, it is excellent in luminous efficiency. Oxygen has a large absorption coefficient to this light, as a result, it can generate a radical oxygen atom species and ozone in high concentration with a very small amount of oxygen.

Moreover, it is known that the light energy of a short wavelength of 172 nm has a high potential to dissociate a bond in an organic substance. Property modification of a polysilazane film will be realized in a short time with the high energy which is possessed by this active oxygen, ozone, and UV ray radiation.

An excimer lamp has a high efficiency of light generation, as a result, it is possible to make the light switch on by an injection of low electric power. Moreover, it does not emit light with a long wavelength which will be a factor of temperature increase, but since it emits energy of a single wavelength in a UV region, it has a distinctive feature of suppressing an increase of a surface temperature of an exposure subject. For this reason, it is suitable for flexible film materials, such as polyethylene terephthalate which is supposed to be easily affected by heat.

Oxygen is required for the reaction during UV ray irradiation. Since a vacuum UV ray is absorbed by oxygen, efficiency during the step of UV ray irradiation is likely to decrease. Therefore, irradiation of the vacuum UV rays is preferably carried out at a concentration of oxygen and water vapor being as low as possible. That is, an oxygen concentration is preferably in the range of 10 to 20,000 ppm in volume, and more preferably, it is in the range of 50 to 10,000 ppm in volume. Further, a water vapor concentration during the conversion process is preferably in the range of 1,000 to 4,000 ppm in volume.

As a gas which is used during vacuum UV ray irradiation and fills an irradiation atmosphere, a dry inactive gas is preferably used. In particular, a dry nitrogen gas is preferable from the viewpoint of cost. The adjustment of an oxygen concentration may be made by measuring a flow rate of an oxygen gas and an inactive gas introduced in an irradiation chamber and by changing a flow rate ratio.

In a step of vacuum UV ray irradiation, illuminance of the aforesaid vacuum UV rays which are received at a coated layer surface of a polysilazane coated layer is preferably in the range of 1 mW/cm2 to 10 W/cm2, preferably, it is in the range of 30 mW/cm2 to 200 mW/cm2, and more preferably, it is in the range of 50 mW/cm2 to 160 mW/cm2. When it is 1 W/cm2 or more, the reforming efficiency will be kept, and when it is 10 W/cm2 or less, vacuum UV ray irradiation can be done without concern of producing ablation in the coated layer or giving damage to the substrate.

An amount of irradiation energy (irradiation amount) of vacuum UV rays at a coated layer surface is preferably in the range of 10 to 10,000 mJ/cm2, more preferably, it is in the range of 100 to 8,000 mJ/cm2, still more preferably, it is in the range of 200 to 6,000 mJ/cm2. When it is 10 mJ/cm2 or more, sufficiently reformed layer may be obtained, and when it is 10,000 mJ/cm2 or less, it will prevent to produce crack due to over reforming or thermal deformation of the substrate.

The vacuum UV rays used for reforming may be generated from plasma which is formed with a gas containing at least one of CO, CO2 and CH4.

A gas containing at least one of CO, CO2 and CH4 (hereafter, it is also called as "a carbon containing gas"), may be used singly, however, it is preferable to add a small amount of carbon containing gas to a rare gas or a hydrogen gas used as a main gas. Capacitive coupled plasma may be cited as a method of generating plasma.

A layer composition of a polysilazane reforming layer may be determined by measuring an atomic composition ratio with an XPS surface analyzing apparatus. Further, it may be determined by cutting the polysilazane reforming layer, and by measuring an atomic composition ratio at a cross section with an XPS surface analyzing apparatus.

A layer density of a polysilazane reforming layer is appropriately set depending on the purpose. For example, it is preferable to be in the range of 1.5 to 2.6 g/cm3. When it is in this range, compactness of the layer and a gas barrier property will be improved, and oxidation deterioration of the layer by humidity will be prevented.

A polysilazane reforming layer may be a single layer, and it may be used a laminated structure of two or more layers.

Constitutions directly related to light emission of an organic EL element of the present invention will be described specifically.

Representative element constitutions used for an organic EL element of the present invention are as follows, however, the present invention is not limited to these.

(1) Anode/light emitting layer/cathode
(2) Anode/light emitting layer/electron transport layer/cathode
(3) Anode/hole transport layer/light emitting layer/cathode
(4) Anode/hole transport layer/light emitting layer/electron transport layer/cathode
(5) Anode/hole transport layer/light emitting layer/electron transport layer/electron injection layer/cathode
(6) Anode/hole injection layer/hole transport layer/light emitting layer/electron transport layer/cathode (7) Anode/hole injection layer/hole transport layer/(electron blocking layer)/light emitting layer/(hole blocking layer)/electron transport layer/electron injection layer/cathode Among these, the embodiment (7) is preferably used. However, the present invention is not limited to this. In the above-described representative element constitution, the layers except the anode and the cathode are organic functional layers having a light emitting property. In the organic EL element of the present invention, the first electrode 15 or the second electrode 17 will compose the anode or the cathode as described above.

(Organic Functional Layer)

In the above-described constitutions, the light emitting layer unit is composed of a single layer or plural layers. When the light emitting layer unit contains plural layers, a non-light emitting intermediate layer may be placed between the light emitting layers.

In addition, it may be provided with a hole blocking layer (a hole barrier layer) or an electron injection layer (a cathode buffer layer) between the light emitting layer and the cathode. Further, it may be provided with an electron blocking layer (an electron barrier layer) or an hole injection layer (an anode buffer layer) between the light emitting layer and the anode.

An electron transport layer is a layer having a function of transporting an electron. An electron transport layer includes an electron injection layer, and a hole blocking layer in a broad sense. Further, an electron transport layer unit may be composed of plural layers.

A hole transport layer is a layer having a function of transporting a hole. A hole transport layer includes a hole injection layer, and an electron blocking layer in a broad sense. Further, a hole transport layer unit may be composed of plural layers.

(Tandem Structure)

An organic functional layer 16 may be a so-called tandem element in which plural organic functional layers each containing at least one light emitting are laminated.

Examples of an element constitution having a tandem structure are as follows:
(1) Anode/first organic functional layer/intermediate layer/second organic functional layer/cathode; and
(2) Anode/first organic functional layer/intermediate layer/second organic functional layer/intermediate layer/third organic functional layer/cathode.

Here, the above-described first organic functional layer, second organic functional layer, and third organic functional layer may be the same or different. It may be possible that two organic functional layers are the same and the remaining one organic functional layer is different.

In addition, the organic functional layers each may be laminated directly or they may be laminated through an intermediate functional layer. Examples of an intermediate functional layer are: an intermediate electrode, an intermediate conductive layer, a charge generating layer, an electron extraction layer, a connecting layer, and an intermediate insulating layer. Known composing materials may be used as long as it can form a layer which has a function of supplying an electron to an adjacent layer to the anode, and a hole to an adjacent layer to the cathode.

Examples of a material used in an intermediate functional layer are: conductive inorganic compounds such as ITO (indium tin oxide), IZO (indium zinc oxide), ZnO2, TiN, ZrN, HfN, TiOX, VOX, CuI, InN, GaN, CuAlO2, CuGaO2, SrCu2O2, LaB6, RuO2, and Al; a two-layer film such as Au/Bi2O3; a multi-layer film such as SnO2/Ag/SnO2, ZnO/Ag/ZnO, Bi2O3/Au/Bi2O3, TiO2/TiN/TiO2, and TiO2/ZrN/TiO2; fullerene such as C60; and a conductive organic layer such as oligothiophene, metal phthalocyanine, metal-free phthalocyanine, metal porphyrin, and metal-free porphyrin. The present invention is not limited to them.

Examples of a tandem type organic functional layer are described in: U.S. Pat. No. 6,337,492, U.S. Pat. No. 7,420,203, U.S. Pat. No. 7,473,923, U.S. Pat. No. 6,872,472, U.S. Pat. No. 6,107,734, U.S. Pat. No. 6,337,492, WO 2005/009087, JP-A 2006-228712, JP-A 2006-24791, JP-A 2006-49393, JP-A 2006-49394, JP-A 2006-49396, JP-A 2011-96679, JP-A 2005-340187, JP Patent 4711424, JP Patent 3496681, JP Patent 3884564, JP Patent 4213169, JP-A 2010-192719, JP-A 2009-076929, JP-A 2008-078414, JP-A 2007-059848, JP-A 2003-272860, JP-A 2003-045676, and WO 2005/094130. The constitutions of the elements and the composing materials are described in these documents, however, the present invention is not limited to them.

[Light Emitting Layer]

A light emitting layer used in an organic EL element of the present invention is a layer which provide a place of emitting light via an exciton produce by recombination of electrons and holes injected from an electrode or an adjacent layer. The light emitting portion may be either within the light emitting layer or at an interface between the light emitting layer and an adjacent layer thereof.

A total thickness of the light emitting layer is not particularly limited.

However, in view of layer homogeneity, required voltage during light emission, and stability of the emitted light color against a drive electric current, a layer thickness is preferably adjusted to be in the range of 2 nm to 5 μm, more preferably, it is in the range of 2 nm to 500 nm, and still most preferably, it is in the range of 5 nm to 200 nm.

Each light emitting layer is preferably adjusted to be in the range of 2 nm to 1 μm, more preferably, it is in the range of 2 nm to 200 nm, and still most preferably, it is in the range of 3 nm to 150 nm.

It is preferable that the light emitting layer incorporates a light emitting dopant (a light emitting dopant compound, a dopant compound, or simply called as a dopant) and a host compound (a matrix material, a light emitting host compound, or simply called as a host).

(1. Light Emitting Dopant)

As a light emitting dopant used in a light emitting layer, it is preferable to employ: a fluorescence emitting dopant (also referred to as a fluorescent dopant and a fluorescent compound) and a phosphorescence emitting dopant (also referred to as a phosphorescent dopant and a phosphorescent emitting material). Among these, it is preferable that at least one light emitting layer contains a phosphorescence emitting dopant.

A concentration of a light emitting dopant in a light emitting layer may be arbitrarily decided based on the specific dopant employed and the required conditions of the device. A concentration of a light emitting dopant may be uniform in a thickness direction of the light emitting layer, or it may have any concentration distribution.

A light emitting layer may contain plural light emitting dopants. For example, it may use a combination of dopants each having a different structure, or a combination of a fluorescence emitting dopant and a phosphorescence emitting dopant. Any required emission color will be obtained by this.

Color of light emitted by an organic EL element of the present invention is specified as follows. In FIG. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-2000 (produced by Konica Minolta, Inc.) are applied to the CIE chromaticity coordinate, whereby the color is specified.

It is preferable that the organic EL element of the present invention exhibits white emission by incorporating one or plural light emitting layers contain plural emission dopants having different emission colors. The combination of emission dopants producing white is not specifically limited. It may be cited, for example, combinations of: blue and orange; and blue, green and red.

It is preferable that "white" in the organic EL element of the present invention shows chromaticity in the CIE 1931 Color Specification System at 1,000 cd/m2 in the region of X=0.39±0.09 and Y=0.38±0.08, when measurement is done to 2-degree viewing angle front luminance via the aforesaid method.

(1-1. Phosphorescence Emitting Dopant)

The phosphorescence emitting dopant is a compound which is observed emission from an excited triplet state thereof. Specifically, it is a compound which emits phosphorescence at room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescence emitting dopant are cited. One is an energy transfer-type, wherein carriers recombine on a host compound on which the carriers are transferred to produce an excited state of the host compound, and then, via transfer of this energy to a phosphorescent dopant, emission from the phosphorescence emitting dopant is realized. The other is a carrier trap-type, wherein a phosphorescence emitting dopant serves as a carrier trap and then carriers recombine on the phosphorescent dopant to generate emission from the phosphorescent dopant. In each case, the excited state energy of the phosphorescent dopant is required to be lower than that of the host compound.

A phosphorescence emitting dopant may be suitably selected and employed from the known materials used for a light emitting layer for an organic EL element of the present invention.

Examples of a known phosphorescence emitting dopant are compound described in the following publications.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/0202194, US 2007/0087321, and US 2005/0244673.

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US 2002/0034656, U.S. Pat. No. 7,332,232, US 2009/0108737, US 2009/0039776, U.S. Pat. No. 6,921,915, U.S. Pat. No. 6,687,266, US 2007/0190359, US 2006/0008670, US 2009/0165846, US 2008/0015355, U.S. Pat. No. 7,250,226, U.S. Pat. No. 7,396,598, US 2006/0263635, US 2003/0138657, US 2003/0152802, and U.S. Pat. No. 7,090,928.

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2007/004380, WO 2006/082742, US 2006/0251923, US 2005/0260441, U.S. Pat. No. 7,393,599, U.S. Pat. No. 7,534,505, U.S. Pat. No. 7,445,855, US 2007/0190359, US 2008/0297033, U.S. Pat. No. 7,338,722, US 2002/0134984, and U.S. Pat. No. 7,279,704.

WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, JP-A 2012-069737, JP-A 2012-195554, JP-A 2009-114086, JP-A 2003-81988, JP-A 2002-302671 and JP-A 2002-363552.

Among them, preferable phosphorescence emitting dopants are organic metal complexes containing Ir as a center metal. More preferable are complexes containing at least one coordination mode selected from a metal-carbon bond, a metal-nitrogen bond, a metal-oxygen bond and a metal-sulfur bond.

Specific examples of a known phosphorescence emitting dopant applicable to a light emitting layer are cited in the following. The phosphorescence emitting dopants are not limited to them, and other compound may be applied.

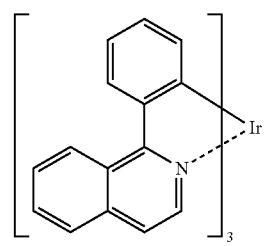

D-1

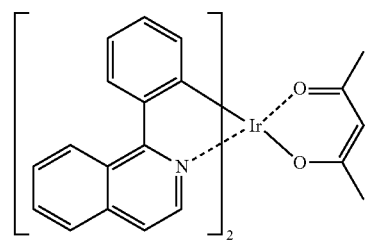

D-2

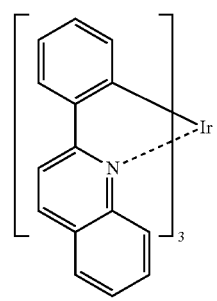

D-3

D-4 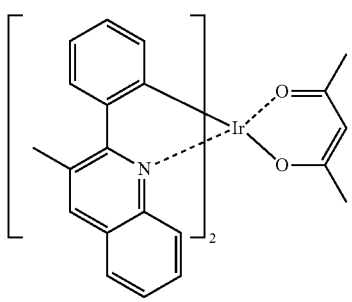
D-5 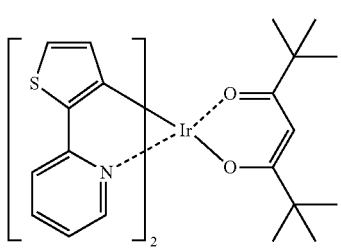
D-6 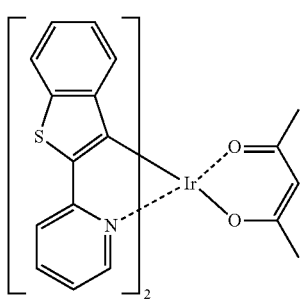
D-7 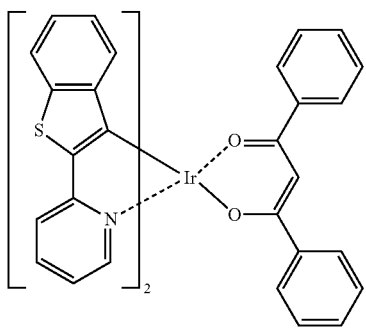
D-8 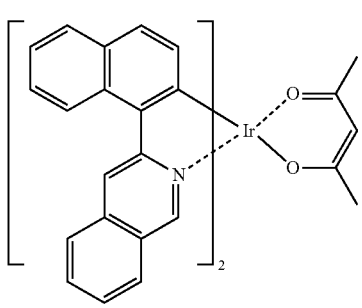
D-9 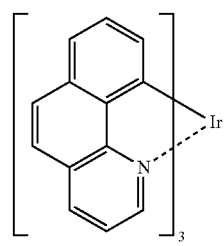
D-10 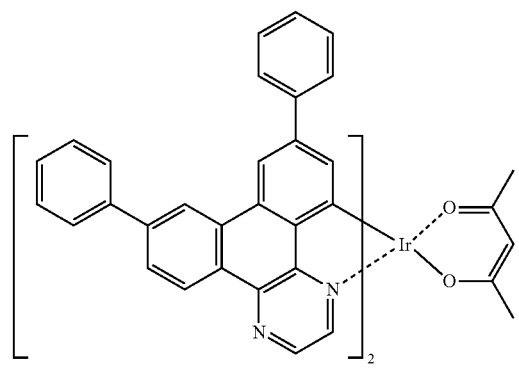
D-11 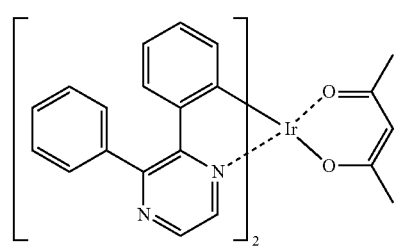
D-12 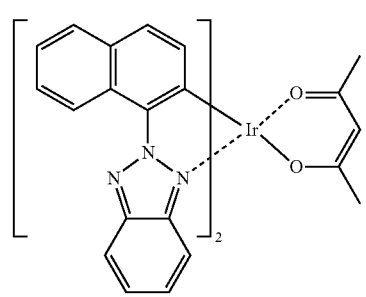
D-13 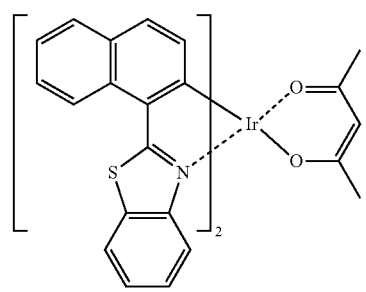

D-14
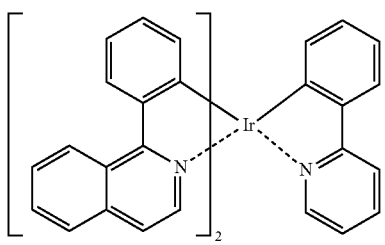
D-15
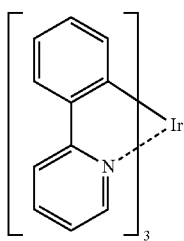
D-16
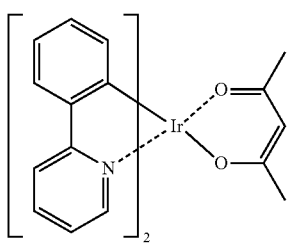
D-17
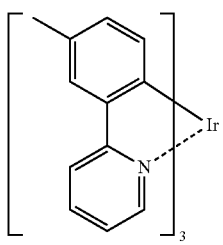
D-18
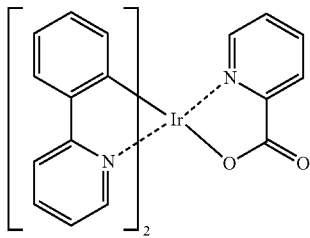
D-19
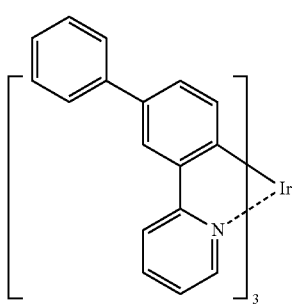
D-20
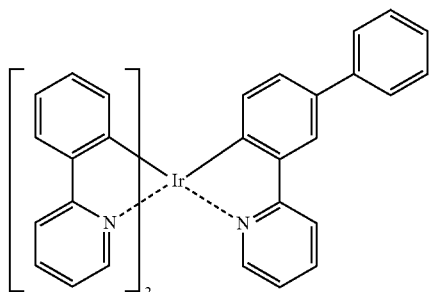
D-21
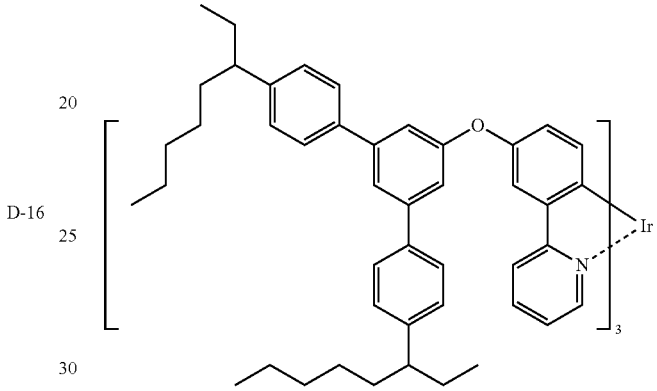
D-22
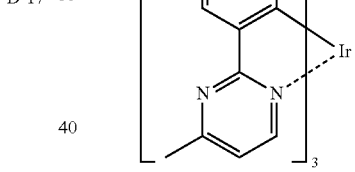
D-23
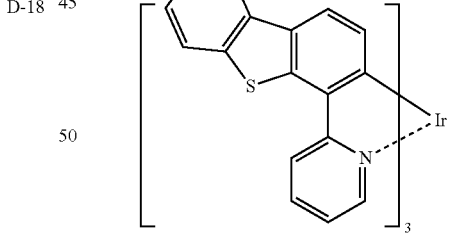
D-24
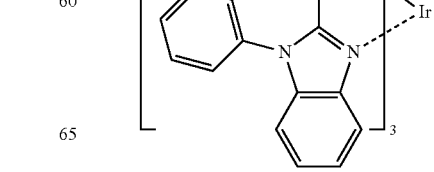

D-25 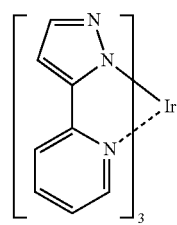
D-26 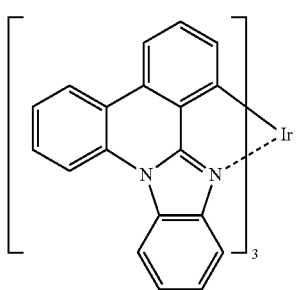
D-27 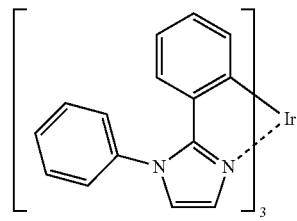
D-28 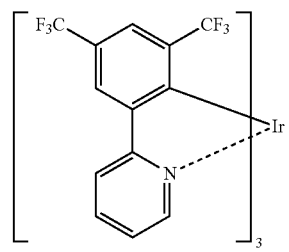
D-29 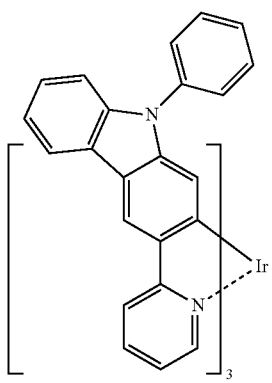
D-30 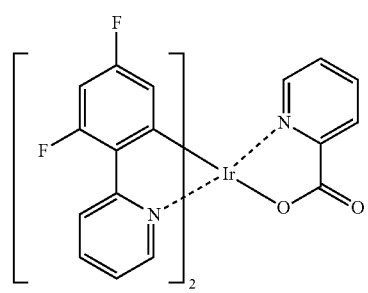
D-31 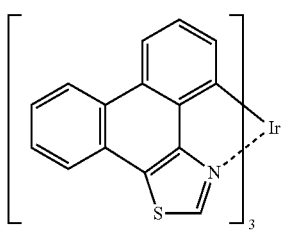
D-32 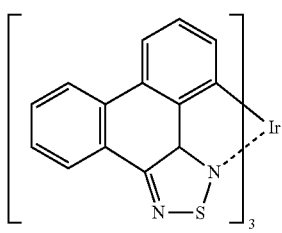
D-33 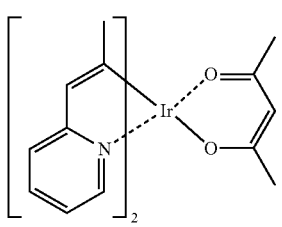
D-34 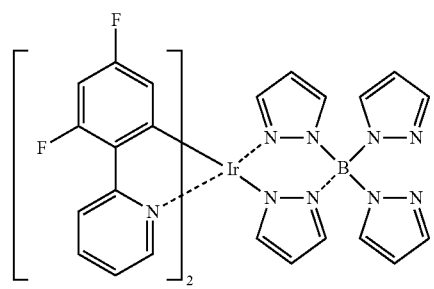
D-35 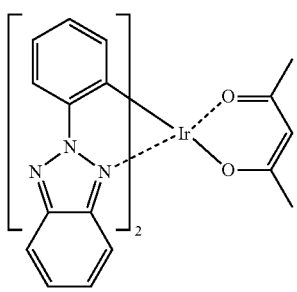
D-36 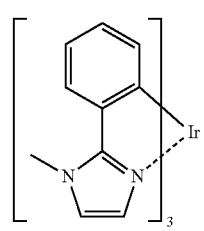

D-37 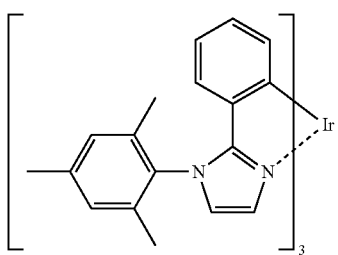
D-38 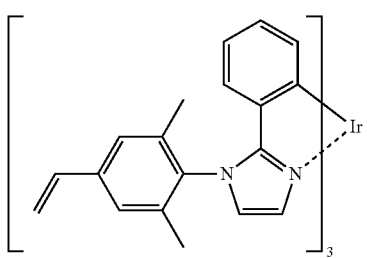
D-39 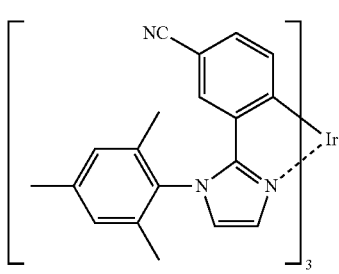
D-40 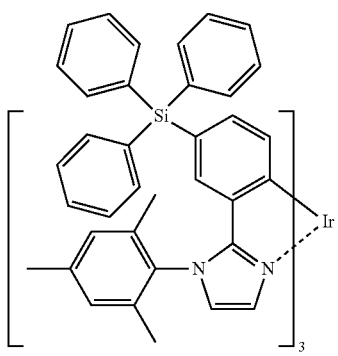
D-41 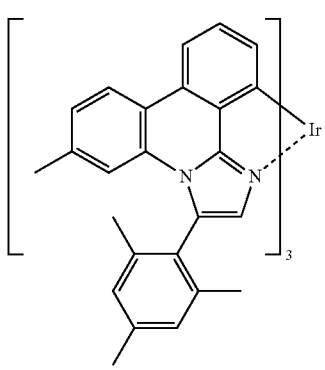
D-42 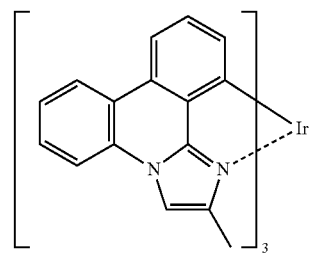
D-43 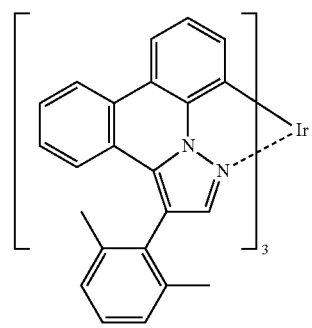
D-44 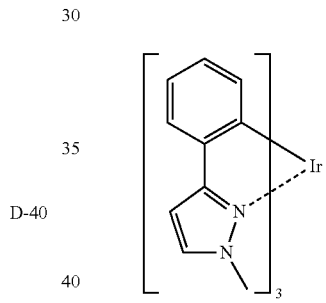
D-45 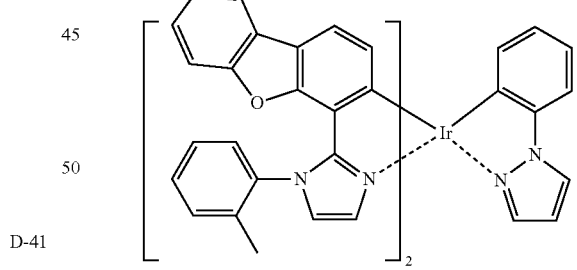
D-46 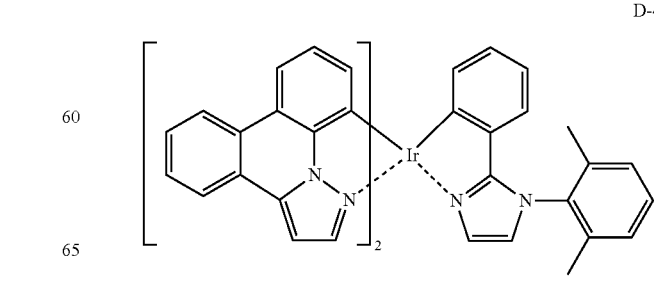

D-47
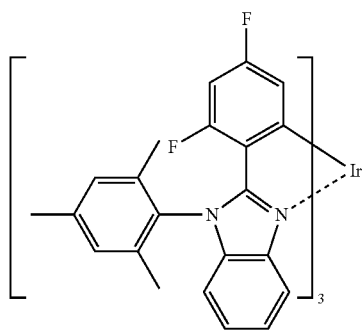
D-48
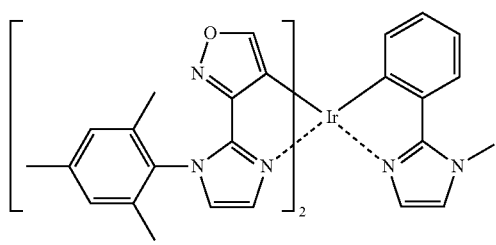
D-49
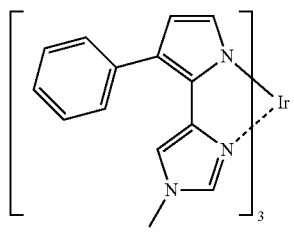
D-50
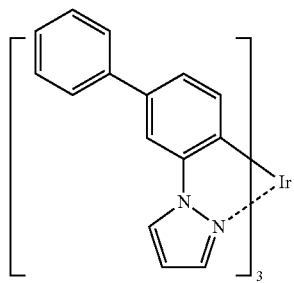
D-51
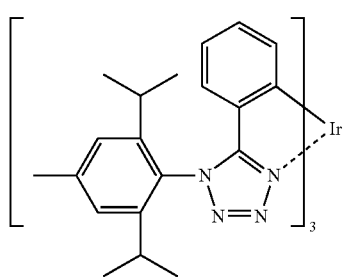
D-52
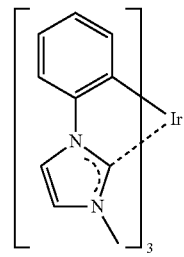
D-53
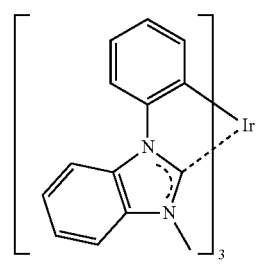
D-54
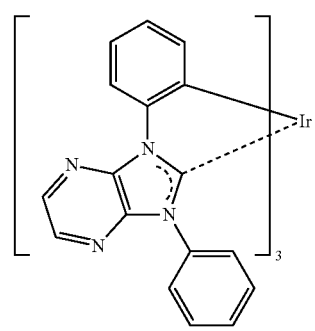
D-55
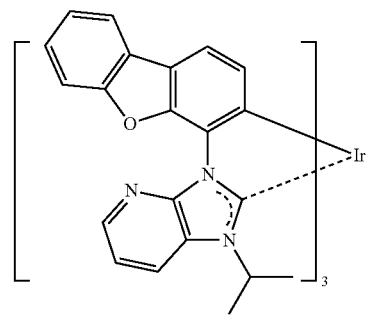
D-56
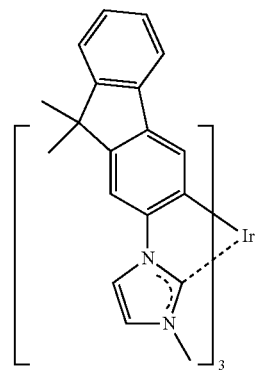

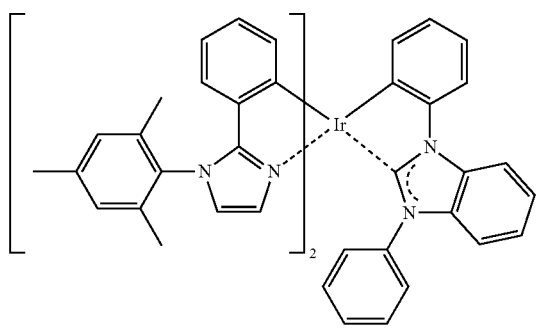
D-57
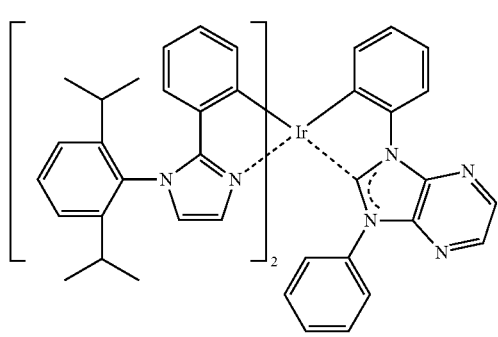
D-58
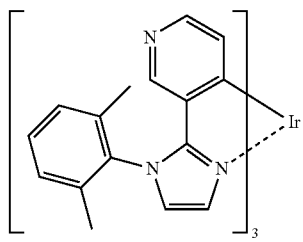
D-59
D-60
D-61
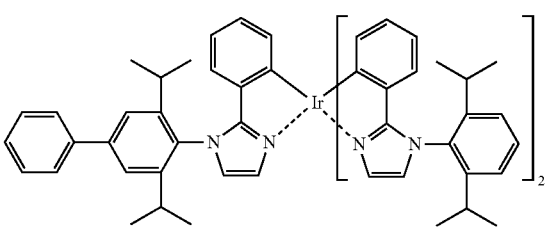
D-62
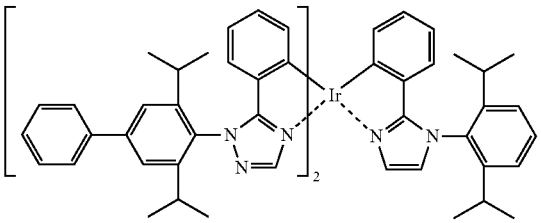
D-63
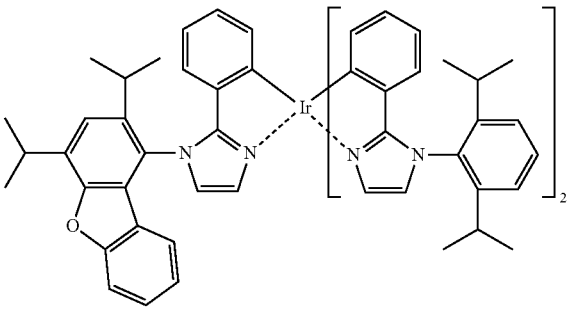
D-64
D-65
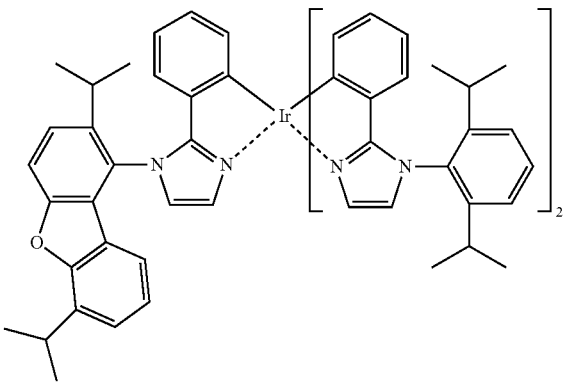
D-66

D-67 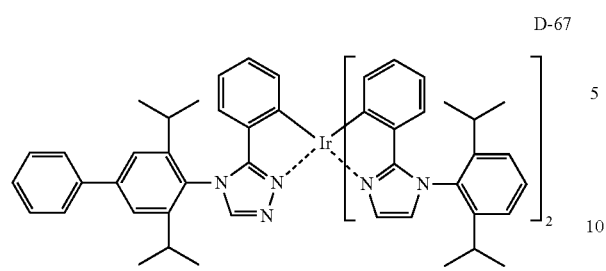
D-72 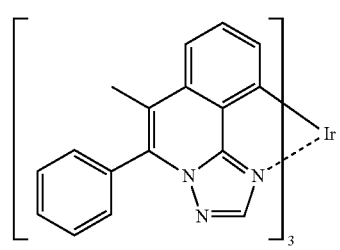
D-68 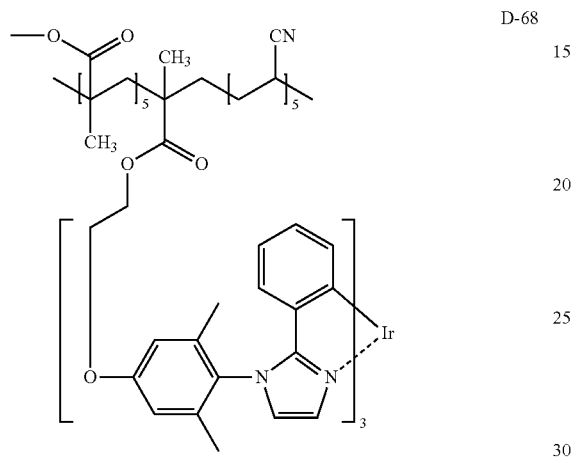
D-73 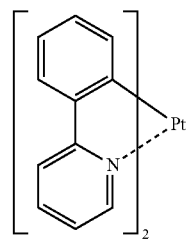
D-74
D-69 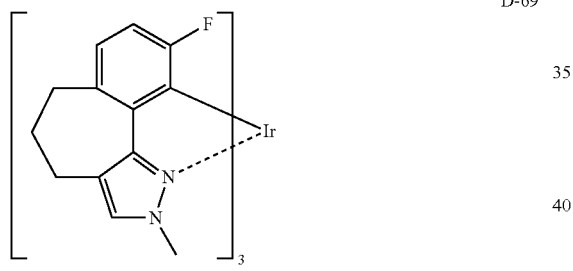
D-75 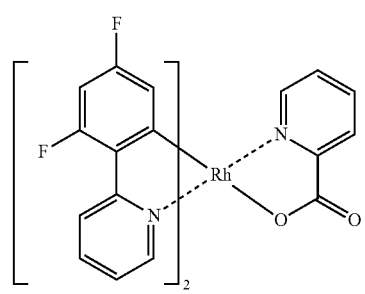
D-70 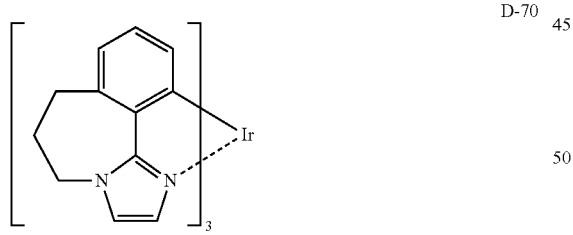
D-76 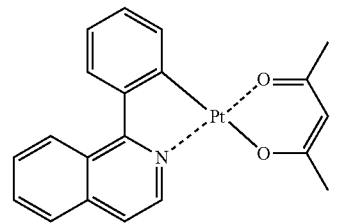
D-71 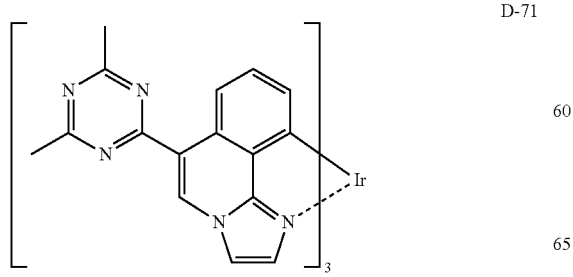
D-77 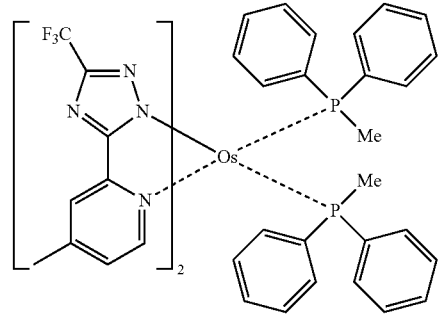

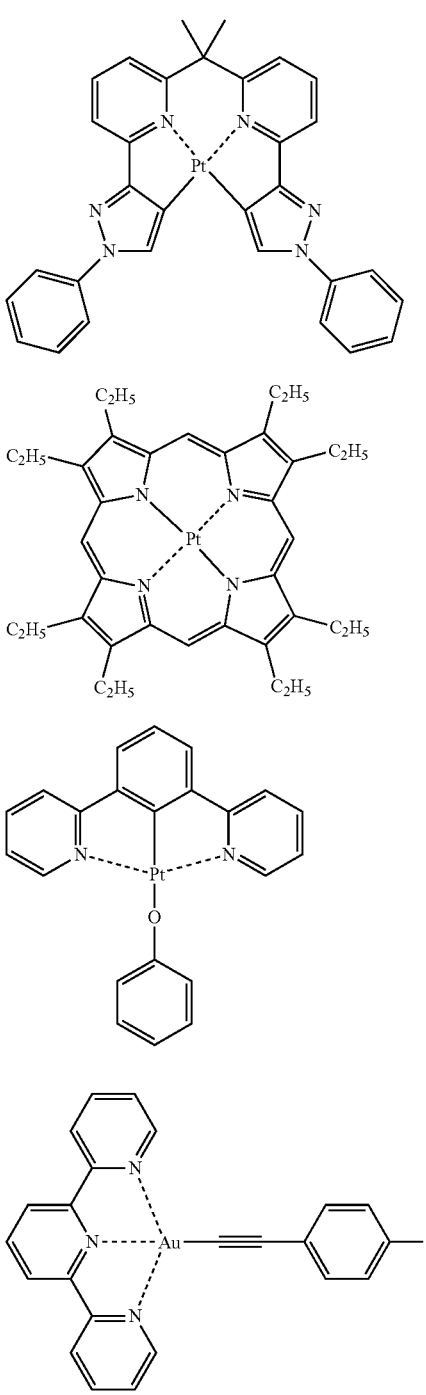

(1-2. Fluorescence Emitting Dopant)

A fluorescence emitting dopant is a compound which is capable of emitting light from an excited singlet. It is not specifically limited as long as an emission from an excited singlet is observed.

As fluorescence emitting dopants, listed are compounds such as: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarium derivative, an oxobenzanthracene derivative, a fluorescein derivative, a rhodamine derivative, a pyrylium derivative, a perylene derivative, a polythiophene derivative, and a rare earth complex compound.

As a fluorescence emitting dopant, it may be used a light emitting dopant utilizing delayed fluorescence. Specific examples of utilizing delayed fluorescence are compounds described in: WO 2011/156793, JP-A 2011-213643, and JP-A 2010-93181.

(2. Host Compound)

A host compound is a compound which mainly plays a role of injecting or transporting a charge in a light emitting layer. In an organic EL element, an emission from the host compound itself is substantially not observed. Preferably, a host compound is a compound exhibiting a phosphorescent quantum yield of the phosphorescence emission of less than 0.1 at room temperature (25° C.). More preferably, it is a compound exhibiting a phosphorescent quantum yield of less than 0.01. Further, among the compounds incorporated in the light emitting layer, a mass ratio of the host compound in the aforesaid layer is preferably at least 20%.

It is preferable that an exited energy level of a host compound is higher than an exited energy level of a light emitting dopant incorporated in the same layer.

Host compounds may be used singly or may be used in combination of two or more compounds. By using plural host compounds, it is possible to adjust transfer of charge, thereby it is possible to achieve high efficiency of an organic EL element.

A host compound used in a light emitting layer is not specifically limited, and known compounds used in organic EL elements may be used. For example, it may be either a low molecular weight compound or a polymer compound having a repeating unit. Further, it may be a compound provided with a reactive group such as a vinyl group and an epoxy group.

A known light emitting host which may be used in the present invention is preferably a compound having a hole transporting ability and an electron transporting ability, as well as preventing elongation of an emission wavelength and having a high Tg (a glass transition temperature). It is preferable that a host compound has a Tg of 90° C. or more, more preferably, has a Tg of 120° C. or more. A glass transition temperature (Tg) is a value obtained using DCS (Differential Scanning Colorimetry) based on the method in conformity to JIS-K-7121.

As specific examples of a host compounds, the compounds described in the following Documents are cited. However, the present invention is not to them.

Japanese patent application publication (JP-A) Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837; US Patent Application Publication (US) Nos. 2003/0175553, 2006/0280965, 2005/0112407, 2009/0017330, 2009/0030202, 2005/0238919; WO 2001/039234, WO 2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297 and EP 2034538.

[Electron Transport Layer]

An electron transport layer used for an organic EL element of the present invention is composed of a material having a function of transferring an electron. It has a function of transporting an injected electron from a cathode to a light emitting layer.

An electron transport material may be used singly or plural kinds may be used in combination.

A total layer thickness of the electron transport layer is not specifically limited, however, it is generally in the range of 2 nm to 5 μm, and preferably, it is in the range of 2 nm to 500 nm, and more preferably, it is in the range of 5 nm to 200 nm.

In an organic EL element of the present invention, it is known that there occurs interference between the light directly taken from the light emitting layer and the light reflected at the electrode located at the opposite side of the electrode from which the light is taken out at the moment of taking out the light which is produced in the light emitting layer. When the light is reflected at the cathode, it is possible to use effectively this interference effect by suitably adjusting the total thickness of the electron transport layer in the range of several nm to several μm.

On the other hand, the voltage will be increased when the layer thickness of the electron transport layer is made thick. Therefore, especially when the layer thickness is large, it is preferable that the electron mobility in the electron transport layer is 10-5 cm2/Vs or more.

As a material used for an electron transport layer (hereafter, it is called as an electron transport material), it is only required to have either a property of ejection or transport of electrons, or a bather to holes. Any of the conventionally known compounds may be selected and they may be employed.

Cited examples are: a nitrogen-containing aromatic heterocyclic derivative, an aromatic hydrocarbon ring derivative, a dibenzofuran derivative, a dibenzothiophene derivative, and a silole derivative.

Examples of the aforesaid nitrogen-containing aromatic heterocyclic derivative are: a carbazole derivative, an azacarbazole derivative, (a compound in which one or more carbon atoms constituting the carbazole ring are substitute with nitrogen atoms), a pyridine derivative, a pyrimidine derivative, a pyrazine derivative, a pyridazine derivative, a triazine derivative, a quinoline derivative, a quinoxaline derivative, a phenanthroline derivative, an azatriphenylene derivative, an oxazole derivative, a thiazole derivative, an oxadiazole derivative, a thiadiazole derivative, a triazole derivative, a benzimidazole derivative, a benzoxazole derivative, and a benzothiazole derivative.

Examples of an aromatic hydrocarbon ring derivative are: a naphthalene derivative, an anthracene derivative, and a triphenylene derivative.

Further, metal complexes having a ligand of a 8-quinolinol structure or dibnenzoquinolinol structure such as tris(8-quinolinol)aluminum (Alq3), tris(5,7-dichloro-8-quinolinol) aluminum, tris(5,7-dibromo-8-quinolinol)aluminum, tris(2-methyl-8-quinolinol)aluminum, tris(5-methyl-8-quinolinol) aluminum and bis(8-quinolinol)zinc (Znq); and metal complexes in which a central metal of the aforesaid metal complexes is substituted by In, Mg, Cu, Ca, Sn, Ga or Pb, may be also utilized as an electron transport material.

Further, metal-free or metal phthalocyanine, or a compound whose terminal is substituted by an alkyl group or a sulfonic acid group, may be preferably utilized as an electron transport material.

A distyryl pyrazine derivative, which is exemplified as a material for a light emitting layer, may be used as an electron transport material. Further, in the same manner as used for a hole injection layer and a hole transport layer, an inorganic semiconductor such as an n-type Si and an n-type SiC may be also utilized as an electron transport material. It may be used a polymer compound having incorporating any one of these compound in a polymer side chain, or a compound having any one of these compound in a polymer main chain.

Further, in an organic EL element of the present invention, it is possible to employ an electron transport layer of a higher n property (electron rich) which is doped with impurities as a guest material. As examples of a dope material, listed are those described in each of JP-A Nos. 4-297076, 10-270172, 2000-196140, 2001-102175, as well as in J. Appl. Phys., 95, 5773 (2004).

Although the present invention is not limited thereto, preferable examples of a known electron transport material used in an organic EL element of the present invention are compounds described in the following publications: U.S. Pat. No. 6,528,187, U.S. Pat. No. 7,230,107, US 2005/0025993, US 2004/0036077, US 2009/0115316, US 2009/0101870, US 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, WO 2004/080975, WO 2004/063159, WO 2005/085387, WO 2006/067931, WO 2007/086552, WO 2008/114690, WO 2009/069442, WO 2009/066779, WO 2009/054253, WO 2011/086935, WO 2010/150593, WO 2010/047707, EP 2311826, JP-A 2010-251675, JP-A 2009-209133, JP-A 2009-124114, JP-A 2008-277810, JP-A 2006-156445, JP-A 2005-340122, JP-A 2003-45662, JP-A 2003-31367, JP-A 2003-282270, and WO 2012/115034.

Examples of a more preferable electron transport material are: a pyridine derivative, a pyrimidine derivative, a pyrazine derivative, a triazine derivative, a dibenzofuran derivative, a dibenzothiophene derivative, a carbazole derivative, an azacarbazole derivative, and a benzimidazole derivative.

[Hole Blocking Layer]

A hole blocking layer is a layer provided with a function of an electron transport layer in a broad meaning. Preferably, it contains a material having a function of transporting an electron, and having very small ability of transporting a hole. It can improve the recombination probability of an electron and a hole by blocking a hole while transporting an electron. Further, a composition of an electron transport layer described above may be appropriately utilized as a hole blocking layer when needed.

A hole blocking layer placed in an organic EL element of the present invention is preferably arranged at a location in the light emitting layer adjacent to the cathode side.

In an organic EL element of the present invention, a thickness of a hole blocking layer is preferably in the range of 3 nm to 100 nm, and more preferably, in the range of 5 nm to 30 nm.

With respect to a material used for a hole blocking layer, the material used in the aforesaid electron transport layer is suitably used, and further, the material used as the aforesaid host compound is also suitably used for a hole blocking layer.

[Electron Injection Layer]

An electron injection layer (it is also called as "a cathode buffer layer") is a layer which is arranged between a cathode and a light emitting layer to decrease an operating voltage and to improve an emission luminance. An example of an electron injection layer is detailed in volume 2, chapter 2

"Electrode materials" (pp. 123-166) of "Organic EL Elements and Industrialization Front thereof (Nov. 30, 1998, published by N.T.S. Co. Ltd.)".

An electron injection layer is provided in an organic EL element of the present invention according to necessity, and as described above, it is placed between a cathode and a light emitting layer, or between a cathode and an electron transport layer.

An electron injection layer is preferably a very thin layer. The layer thickness thereof is preferably in the range of 0.1 nm to 5 nm depending on the materials used. In addition, the layer may be an unequal layer in which the composing material exists intermittently.

An election injection layer is detailed in JP-A Nos. 6-325871, 9-17574, and 10-74586. Examples of a material preferably used in an election injection layer include: a metal such as strontium and aluminum; an alkaline metal compound such as lithium fluoride, sodium fluoride, or potassium fluoride; an alkaline earth metal compound such as magnesium fluoride; a metal oxide such as aluminum oxide; and a metal complex such as lithium 8-hydroxyquinolate (Liq). It is possible to use the aforesaid electron transport materials. The above-described materials may be used singly or plural kinds may be used in an election injection layer.

[Hole Transport Layer]

A hole transport layer contains a material having a function of transporting a hole. A hole transport layer is a layer having a function of transporting a hole injected from an anode to a light emitting layer. The total layer thickness of a hole transport layer in an organic EL element of the present invention is not specifically limited, however, it is generally in the range of 0.5 nm to 5 μm, preferably in the range of 2 nm to 500 nm, and more preferably in the range of 5 nm to 200 nm.

A material used in a hole transport layer (hereafter, it is called as a hole transport material) is only required to have any one of properties of injecting and transporting a hole, and a barrier property to an electron. A hole transport material may be suitably selected from the conventionally known compounds. A hole transport material may be used singly, or plural kinds may be used.

Examples of a hole transport material include: a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazone derivative, a stilbene derivative, a polyarylalkane derivative, a triarylamine derivative, a carbazole derivative, an indolocarbazole derivative, an isoindole derivative, an acene derivative of anthracene or naphthalene, a fluorene derivative, a fluorenone derivative, polyvinyl carbazole, a polymer or an oligomer containing an aromatic amine in a side chain or a main chain, polysilane, and a conductive polymer or oligomer (e.g., PEDOT:PSS, aniline type copolymer, polyaniline and polythiophene).

Examples of a triarylamine derivative include: a benzidine type represented by α-NPD, a star burst type represented by MTDATA, a compound having fluorenone or anthracene in a triarylamine bonding core.

A hexaazatriphenylene derivative described in JP-A Nos. 2003-519432 and 2006-135145 may be also used as a hole transport material.

In addition, it is possible to employ an electron transport layer of a higher p property which is doped with impurities. As its example, listed are those described in each of JP-A Nos. 4-297076, 2000-196140, and 2001-102175, as well as in J. Appl. Phys., 95, 5773 (2004).

Further, it is possible to employ so-called p-type hole transport materials, and inorganic compounds such as p-type Si and p-type SiC, as described in JP-A No. 11-251067, and J. Huang et al. reference (Applied Physics Letters 80 (2002), p. 139). Moreover, an orthometal compounds having Ir or Pt as a center metal represented by Ir(ppy)3 are also preferably used.

Although the above-described compounds may be used as a hole transport material, preferably used are: a triarylamine derivative, a carbazole derivative, an indolocarbazole derivative, an azatriphenylene derivative, an organic metal complex, a polymer or an oligomer incorporated an aromatic amine in a main chain or in a side chain.

Examples of a hole transport material used in an organic EL element of the present invention are compounds in the aforesaid publications and in the following publications. However, the present invention is not limited to them.

Appl. Phys. Lett. 69, 2160(1996), J. Lumin 72-74, 985 (1997), Appl. Phys. Lett. 78, 673(2001), Appl. Phys. Lett. 90, 183503(2007), Appl. Phys. Lett. 51, 913(1987), Synth. Met. 87, 171(1997), Synth. Met. 91, 209(1997), Synth. Met. 111, 421(2000), SID Symposium Digest, 37, 923(2006), J. Mater. Chem. 3, 319(1993), Adv. Mater. 6, 677(1994), Chem. Mater. 15, 3148(2003), US 2003/0162053, US 2002/0158242, US 2006/0240279, US 2008/0220265, U.S. Pat. No. 5,061,569, WO 2007/002683, WO 2009/018009, EP 650955, US 2008/0124572, US 2007/0278938, US 2008/0106190, US 2008/0018221, WO 2012/115034, JP-A 2003-519432, JP-A 2006-135145, and U.S. patent application Ser. No. 13/585,981.

[Electron Blocking Layer]

An electron blocking layer is a layer provided with a function of a hole transport layer in a broad meaning. Preferably, it contains a material having a function of transporting a hole, and having very small ability of transporting an electron. It can improve the recombination probability of an electron and a hole by blocking an electron while transporting a hole.

Further, a composition of a hole transport layer described above may be appropriately utilized as an electron blocking layer of an organic EL element of the present invention when needed. An electron blocking layer placed in an organic EL element of the present invention is preferably arranged at a location in the light emitting layer adjacent to the anode side.

A thickness of an electron blocking layer is preferably in the range of 3 nm to 100 nm, and more preferably, in the range of 5 nm to 30 nm.

With respect to a material used for an electron blocking layer, the material used in the aforesaid hole transport layer is suitably used, and further, the material used as the aforesaid host compound is also suitably used for an electron blocking layer.

[Hole Injection Layer]

A hole injection layer (it is also called as "an anode buffer layer") is a layer which is arranged between an electrode and a light emitting layer to decrease an operating voltage and to improve an emission luminance. An example of a hole injection layer is detailed in volume 2, chapter 2 "Electrode materials" (pp. 123-166) of "Organic EL Elements and Industrialization Front thereof (Nov. 30, 1998, published by N.T.S. Co. Ltd.)". A hole injection layer is provided according to necessity, and as described above, it is placed between an anode and a light emitting layer, or between an anode and a hole transport layer.

A hole injection layer is also detailed in JP-A Nos. 9-45479, 9-260062 and 8-288069. Materials used in the hole injection layer are the same materials used in the aforesaid hole transport layer. Among them, preferable materials are: a phthalocyanine derivative represented by copper phthalocyanine; a hexaazatriphenylene derivative described in JP-A Nos. 2003-519432 and 2006-135145; a metal oxide represented by vanadium oxide; a conductive polymer such as amorphous carbon, polyaniline (or called as emeraldine) and polythiophene; an orthometalated complex represented by tris(2-phenylpyridine) iridium complex; and a triarylamine derivative.

The above-described materials used in a hole injection layer may be used singly or plural kinds may be used.

[Other Additive]

An organic functional layer which composes an organic EL element of the present invention may further contain other additive. Examples of an additive are: halogen elements such as bromine, iodine and chlorine, and a halide compound; and a compound, a complex and a salt of an alkali metal, an alkaline earth metal and a transition metal such as Pd, Ca and Na.

Although a content of an additive may be arbitrarily decided, preferably, it is 1,000 ppm or less based on the total mass of the layer containing the additive, more preferably, it is 500 ppm or less, and still more preferably, it is 50 ppm or less.

In order to improve a transporting ability of an electron or a hole, or to facilitate energy transport of an exciton, the content of the additive is not necessarily within these range, and other range of content may be used.

[Forming Method of Organic Functional Layer]

It will be described forming methods of organic functional layers of an organic EL element of the present invention (hole injection layer, hole transport layer, light emitting layer, hole blocking layer, electron transport layer, and electron injection layer).

Forming methods of organic functional layers are not specifically limited.

They may be formed by using a known method such as a vacuum vapor deposition method and a wet method (wet process).

Examples of a wet process include: a spin coating method, a cast method, an inkjet method, a printing method, a die coating method, a blade coating method, a roll coating method, a spray coating method, a curtain coating method, and a LB method (Langmuir Blodgett method).

From the viewpoint of getting a uniform thin layer with high productivity, preferable are method highly appropriate to a roll-to-roll method such as a die coating method, a roll coating method, an inkjet method, and a spray coating method.

In a wet process, examples of a liquid medium to dissolve or to disperse a material for an organic functional layer include: ketones such as methyl ethyl ketone and cyclohexanone; aliphatic esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; organic solvents such as DMF and DMSO.

These will be dispersed with a dispersion method such as an ultrasonic dispersion method, a high shearing dispersion method and a media dispersion method.

When a vapor deposition method is adopted for forming each layer which composes an organic functional layer, the vapor deposition conditions will change depending on the compounds used. Generally, the following ranges are suitably selected for the conditions, heating temperature of boat: 50 to 450° C., level of vacuum: 10-6 to 10-2 Pa, vapor deposition rate: 0.01 to 50 nm/sec, temperature of substrate: −50 to 300° C., and layer thickness: 0.1 nm to 5 μm, preferably 5 nm to 200 nm.

Formation of an organic EL element of the present invention is preferably continuously carried out from an organic functional layer to a cathode with one time vacuuming. It may be taken out on the way, and a different layer forming method may be employed. In that case, the operation is preferably done under a dry inert gas atmosphere. In addition, different formation methods may be applied for each layer.

[First Electrode]

As a first electrode 15, a metal having a large work function (4 eV or more, preferably, 4.3 eV or more), an alloy, and a conductive compound and a mixture thereof are utilized as an electrode substance.

Specific examples of an electrode substance are: metals such as Au and Ag, and an alloy thereof; transparent conductive materials such as CuI, indium tin oxide (ITO), SnO2, and ZnO. Further, a material such as IDIXO (In2O3-ZnO), which can form an amorphous and transparent electrode, may also be used.

As for a first electrode, these electrode substances may be made into a thin layer by a method such as a vapor deposition method or a sputtering method; followed by making a pattern of a desired form by a photolithography method. Otherwise, in the case of requirement of pattern precision is not so severe (about 100 μm or more), a pattern may be formed through a mask of a desired form at the time of layer formation with a vapor deposition method or a sputtering method using the above-described material.

Alternatively, when a coatable substance such as an organic conductive compound is employed, it is possible to employ a wet film forming method such as a printing method or a coating method.

When emitted light is taken out from the side of the first electrode, the transmittance is preferably set to be not less than 10%. A sheet resistance of a first electrode is preferably a few hundred Ω/sq or less. Further, although a layer thickness of the first electrode depends on a material, it is generally selected in the range of 10 nm to 1 μm, and preferably in the range of 10 nm to 200 nm.

Specifically, it is preferable that the first electrode is a layer composed of silver as a main ingredient, and it is preferably made of silver or an alloy containing silver as a main component.

As a forming method of the first electrode as described above, it may be cited: wet processes such as an application method, an inkjet method, a coating method and a dip method; and dry processes such as a vapor deposition method (resistance heating, EB method), a sputtering method, and CVD. Among them, a vapor deposition method is preferably used.

Examples of an alloy which contains silver (Ag) as a main component for forming the first electrode are: silver magnesium (AgMg), silver copper (AgCu), silver palladium (AgPd), silver palladium copper (AgPdCu) and silver indium (AgIn).

The above-described first electrode may have a constitution in which plural layers made of silver or an alloy containing silver as a main component are separately made and they are laminated according to necessity.

Further, a preferable thickness of this first electrode is in the range of 4 nm to 15 nm. When it is 15 nm or less, an absorbing component and a reflection component of the layer may be kept at low level, and as a result, a transparency of the first electrode will be maintained, which is preferable. By making the thickness to be 4 nm or more, the conductivity of the layer will be also maintained.

In the case of forming a layer composed of silver as a main component as a first electrode, it may form an underlayer of the first electrode 13. The underlayer may be other conductive layer containing Pd, or an organic layer containing a nitrogen compound or a sulfur compound. By forming an underlayer, it can improve a layer forming property of a layer composed of silver as a main component; it can decrease resistivity of the first electrode; and it can improve transparency of the first electrode 15.

[Second Electrode]

As a second electrode 17, a metal having a small work function (4 eV or less) (it is called as an electron injective metal), an alloy, a conductive compound and a mixture thereof are utilized as an electrode substance.

Specific examples of the aforesaid electrode substance includes: sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al2O3) mixture, indium, a lithium/aluminum mixture, aluminum, and a rare earth metal.

Among them, with respect to an electron injection property and durability against oxidation, preferable are: a mixture of election injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide (Al2O3) mixture, a lithium/aluminum mixture and aluminum.

The second electrode may be made by using these electrode substances with a method such as a vapor deposition method or a sputtering method. A sheet resistance of a second electrode is preferably a few hundred Ω/sq or less. Further, a layer thickness of the second electrode is generally selected in the range of 10 nm to 5 μm, and preferably in the range of 50 nm to 200 nm.

Further, after forming a layer of the aforesaid metal having a thickness of 1 nm to 20 nm on the second electrode, it is possible to prepare a transparent or translucent second electrode by providing with a conductive transparent material described in the description for First electrode thereon. By applying this process, it is possible to produce an element in which both a first electrode and a second electrode are transparent.

As illustrated by an organic EL element 10B in FIG. 1B and an organic EL element 10C in FIG. 1C, it may use a constitution which employs a substrate or an adhesive. It may add other composition thereto.

A detailed description of the preferred embodiments will be shown below.

[Substrate]

As a substrate 19 used for an organic EL element of the present invention, it is not specifically limited as long as it can provide an organic EL element with a flexible property. As a flexible substrate, it can cite a transparent resin film.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyarylates and cycloolefin resins such as ARTON (trade name made by JSR Co. Ltd.) and APEL (trade name made by Mitsui Chemicals, Inc.).

Among these resin films, preferably used films are, for example, polyethylene terephthalate (PET), polybutylene terephthalate and polyethylene naphthalate (PEN) and polycarbonate (PC) with respect to the cost or the ease of acquisition.

Further, with respect to optical transparency, heat resistance and adhesion with a second gas barrier layer, a heat resistant transparent film having a basic skeleton of silsesquioxane which contains an organic-inorganic hybrid structure may be preferably used.

The thickness of this substrate 19 is preferably about 5 μm to 500 μm, and more preferably, it is within the range of 25 μm to 250 μm. It is preferable that the substrate 19 has a light transparent property. It is possible to achieve an organic EL element having light transparency when the substrate 19 has a light transparent property.

[Adhesive]

In an organic EL element of the present invention, it is preferable that a first gas barrier layer and an intermediate layer are adhered via an adhesive. A second gas barrier layer and an intermediate layer may be also adhered via an adhesive. An adhesive may form a layer as an adhesive layer.

As an adhesive, it is not specially limited as long as it will bond a first gas bather layer to an intermediate layer. Commonly known adhesive agents may be used. In particular, a synthetic resin type adhesive agent is preferably used.

Usable examples of a synthetic resin type adhesive agent are: a pressure-sensitive adhesive, a heat-curable adhesive and a photo-curable adhesive. Specific examples thereof include: an epoxy resin, an acrylic resin, an ionomer resin, a urethane resin, and an ethylene-vinyl acetate copolymer resin.

An adhesive commercially available as a sheet type adhesive laminate may be also preferably used. Such a sheet type adhesive laminate can be obtained from DuPont-Mitsui Polychemicals Co. Ltd., 3M Co., Ajinomoto Co., and Tesa Co. In particular, preferably employed are: Nucrel™ made by DuPont-Mitsui Polychemicals Co. Ltd. (product number: AN4228C, N0903HC, N1525, AN4214C, AN4225C, AN42115C, N0908C, AN42012C, N410, N1035, N1050H, N1108C, H1110H, N1207C, N1214, AN4221C, N1560, NO200H, AN4213C, and NO35C), and "Optically Clear Adhesive™" made by 3M Co. (product number: 8171, 8172, 8172P, 8171CL, and 8172CL).

[Sealing Layer]

Figure 6:
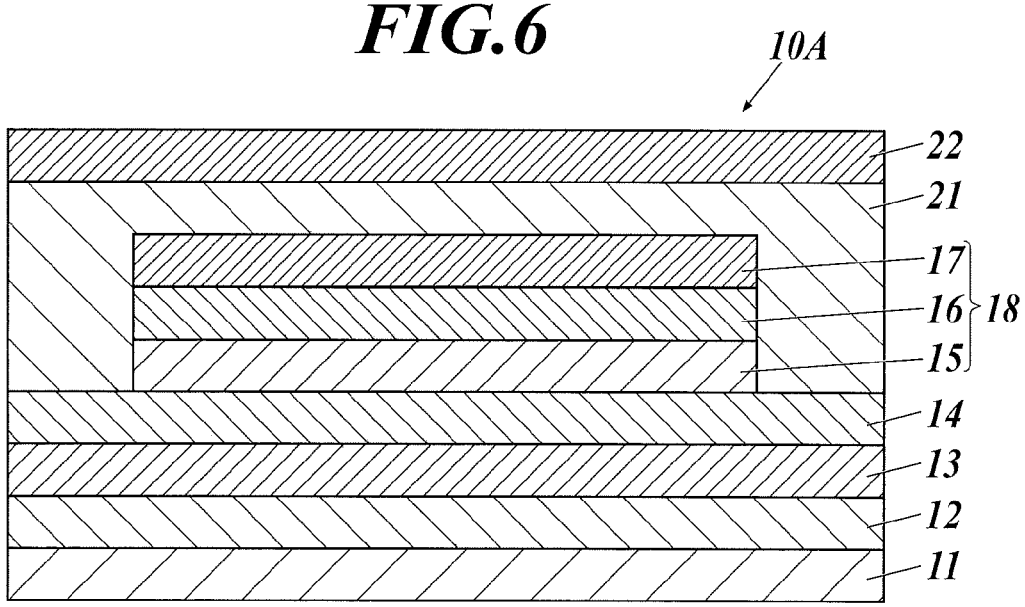
FIG. 6 is a schematic cross-section drawing showing an example of a hole body of an organic electroluminescent element of the present invention.

As illustrated in FIG. 6, an organic EL element of the present invention may have a solid sealing formed by adhering a sealing member 22 through a sealing layer 21 which covers an organic functional layer on a third gas barrier layer.

Solid sealing of the organic EL element may be formed as follows: coating an uncured resin material on adhering surfaces of the sealing member and the third gas barrier layer at plural spreading positions; pressing mutually the sealing member and the third gas barrier layer through the resin sealing material; then curing the resin sealing material to combine into a single unit.

The sealing layer is provided in such a manner as covering the organic functional layer, and making to expose an edge portion (illustration omitted) of the first electrode and the second electrode. It may have a composition in which an electrode is placed on the sealing member, and an electrical connection is made between this electrode and the edge portion of the first electrode and the second electrode.

The sealing layer is composed of a resin sealing material for bonding a third gas barrier layer and the sealing member.

In addition to a resin sealing material, it may be added an inorganic sealing material. For example, it may form a composition in which the organic functional layer is covered with an inorganic sealing layer, then the sealing member and the third gas barrier layer are bonded with the resin sealing layer.

A resin sealing material is used for fixing a sealing member on a side of a third gas barrier layer. In addition, it is used as a sealing agent for sealing an organic functional layer, which is sandwiched between the sealing member and the third gas barrier layer.

In order to bond the sealing member to the third gas barrier layer, it is preferable to bind them using a resin sealing material of any curing type. As a resin sealing material, an appropriate adhesive may be suitably selected from the viewpoint of improving close contact of the sealing member and the third gas barrier layer.

A heat-curable resin is preferably used for such a resin sealing material. As a heat-curable adhesive, it can use a resin containing as a main component: a compound having an ethylenic double bond at an end or a side chain of the molecule; and a thermal polymerization initiator.

More specifically, it can use a heat-curable adhesive composed of an epoxy resin and an acrylic resin. Further, a melt type heat-curable adhesive may be used in accordance with an adhesion apparatus and a hardening treatment apparatus used in the production step of an organic EL element.

A photo-curable resin is preferably used for the above-described resin sealing material. Examples thereof are: a photo-radical polymerizable resin containing, as a main component, various (meth)acrylate such as acrylates polyester (meth)acrylates, polyether (meth)acrylate, epoxy (meth)acrylate, and polyurethane (meth)acrylate; a photo-cationic polymerizable resin containing, as a main component, resins such as an epoxy resin and a vinyl ether resin; and a thiol-ene addition type resin. Among these photo-curable resins, a photo-cationic polymerizable resin of epoxy resin type is preferable in view of low contraction rate of the cured product, low amount of outgassing and excellent in long term reliability.

A chemical hardening (two liquid mixture) resin may be used for such a resin sealing material. Further, hot melt type resins of polyamide, polyester and polyolefin can also be used. In addition, a UV curing epoxy resin of a cationic hardening type may be used.

An organic material which composes an organic EL element may be deteriorated by a heating treatment. Therefore, it is preferable to use a resin sealing material which enables to adhere and to be cured between room temperature and 80° C.

[Sealing Member]

A sealing member 22 covers an organic EL element. A sealing member of a plate type (film type) is fixed to a side of a third gas barrier layer via a sealing layer. Specific examples of a sealing member of a plate type (film type) are a glass substrate and a polymer substrate. These substrate materials may be further made to be a thin film. Examples of a glass substrate include: soda-lime glass, barium-strontium containing glass, lead glass, aluminosilicate glass, borosilicate glass, barium borosilicate glass, and quartz.

Further, listed examples of a polymer substrate are: polycarbonate, acryl, polyethylene terephthalate, polyether sulfide, and polysulfone.

As a sealing member, it is preferable to use a metal foil laminated with a resin film (polymer layer). The metal foil laminated with a resin film cannot be used for a substrate placed at a side from which light is taking out, however, it is low cost and it is a sealing material of low moisture permeability. Therefore, it is suitable for a sealing member which is not intended to take out light.

"A metal foil" in the present invention indicates a foil or a film made of a metal which is produced by a process such as rolling. This is different from: a metal thin layer formed with a sputtering method or a vapor deposition method; or a conductive layer formed by using a fluid electrode material such as a conductive paste.

As a metal foil, the kind of metal is not specifically limited. Examples thereof are: copper (Cu) foil, aluminum (Al) foil, gold (Au) foil, brass foil, nickel (Ni) foil, titanium (Ti) foil, copper alloy foil, stainless steel foil, tin (Sn) foil, and high nickel alloy foil. Among these foils, specifically preferred metal foil is an aluminum (Al) foil.

A thickness of metal foil is preferably in the range of 6 μm to 50 μm. When it is 6 μm or more, it can prevent generation of pinholes which may be produced depending on the used material for metal foil, and required gas barrier properties (vapor permeability and oxygen permeability) will be obtained. When it is 50 μm or less, it can reduce increase of cost caused by the material used for a metal foil. The advantage of using a sealing material of film type is to prevent increase of thickness of an organic EL element.

As a meal foil laminated with a resin film, it may be used a various types of materials disclosed in "New development of functional wrapping materials" (TORAY Research Center. Ltd.) for a resin film.

Examples of a resin for a resin film are: a polyethylene resin, a polypropylene resin, a polyethylene terephthalate resin, a polyamide resin, an ethylene-vinyl alcohol copolymer resin, an ethylene-vinyl acetate copolymer resin, an acrylonitrile-butadiene copolymer resin, a cellophane resin, a vinylon resin, and a vinylidene chloride resin.

A polypropylene resin and a Nylon resin may be stretched, and further, they may be coated with a vinylidene chloride resin. Any one of high density or low density polyethylene resin may be used.

The sealing member is preferably provided with the following properties: an oxygen permeability of $1 \times 10^{-3}$ ml/(m2·24 h·atm) or less, determined based on JIS K 7126-1987; and a water vapor permeability of $1 \times 10^{-3}$ g/(m2·24 h) or less (25±0.5° C., and 90±2% RH) determined based on JIS K 7129-1992.

The aforesaid sealing materials may be processed to form a concave form. In this case, a concave form is formed by carrying out a process such as a sand blast process or a chemical etching process to the aforesaid substrate materials.

A metal material may be used other than these materials. Examples of a metal material are: those composed of at least one metal selected from the group consisting of stainless steel, iron, copper, aluminum, magnesium, nickel, zinc, chromium, titanium, molybdenum, silicon, germanium, and tantalum, or alloys thereof. These metal materials are made into a thin film, and they are used as a sealing member. Thus, an entire light emitting panel provided with an organic EL element will be made thinner.

An inorganic sealing material is a member to seal a light emitting unit composed of a first electrode, an organic functional layer, and a second electrode together with a resin sealing material. Therefore, with respect to the inorganic sealing material, it is preferable to employ a material having a function of preventing penetration of water or oxygen which will deteriorate the organic functional layer.

Further, the inorganic sealing material is a constitution component which directly comes in contact with the second gas barrier layer and the organic functional layer. Therefore, it is preferable to use a material excellent in joining ability with the second gas barrier layer and the organic functional layer.

An inorganic sealing material is preferably formed with a compound such as inorganic oxide, inorganic nitride, and inorganic carbide having a high sealing property.

Specifically, it may be formed with: SiOx, Al2O3, In2O3, TiOx, ITO (indium tin oxide), MN, Si3N4, SiOxN, TiOxN, and SiC.

The inorganic sealing material may be formed with a known method such as a sol-gel method, a vapor deposition method, CVD, ALD (Atomic Layer Deposition), PVD and a sputtering method.

The inorganic sealing material may be formed with an atmospheric pressure plasma method by selecting conditions of: an organic metal compound as a raw ingredient (it is called as a raw material), a decomposition gas, a decomposition temperature, an input electric power. By a suitable selection, it is possible to selectively make a composition of: silicon oxide, inorganic oxide mainly composed of silicon oxide, inorganic oxynitride, inorganic oxyhalide, inorganic carbide, inorganic nitride, inorganic sulfide, and mixture of inorganic halides.

For example, if a silicon compound is used as a raw material compound and oxygen is used for a decomposition gas, a silicon oxide will be generated. Moreover, if silazane is used as a raw material compound, silicon oxynitride will be generated. The reason of this is as follows. In a plasma space, there exist very active charged particles and active radicals in a high density, as a result, a chemical reaction of multi-steps will be extremely accelerated in a plasma space to result in converting into a thermodynamically stable compound in an extremely short time.

As a raw material for forming the above-described inorganic sealing layer, it may be used any silicon compounds of gas, liquid and solid sates at ambient temperature and pressure. When it is a gas, it may be introduced as it is in the plasma space, however, when it is a liquid or a solid, it is used after evaporating with a means such as heating, bubbling, reduced pressure or ultrasonic irradiation. Moreover, it may be used by diluting with a solvent, and organic solvents such as methanol, ethanol, and n-hexane, and a mixed solvent thereof may be used as a solvent. In addition, since these diluting solvents are decomposed into a state of a molecule or an atom during a plasma electric discharge process, their influences will be almost disregarded.

Examples of such a silicon compound are cited as: silane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyl dimethoxysilane, methyl triethoxysilane, ethyl trimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino)dimethylsilane, N,O-bis(trimethylsilyl)acetamide, bis(trimethylsilyl)carbodiimide, diethylaminotrimethylsilane, dimethylaminodimethylsilane, hexamethyldisilazane, hexamethylcyclotrisilazane, heptahexamethyldisilazane, nona methyltrisilazane, octamethylcyclotetrasilazane, tetrakisdimethylaminosilane, tetraisocyanatesilane, tetramethyldisilazane, tris(dimethylamino)silane, triethoxyfluorosilane, allyldimethylsilane, allyltrimethylsilane, benzyltrimethylsilane, his (trimethylsilyl)acetylene, 1,4-bistrimethylsilyl-1,3-butadiyne, di-t-butylsilane, 1,3-disilabutane, his (trimethylsilyl)methane, cyclopentadienyltrimethylsilane, phenyldimethylsilane, phenyltrimethylsilane, propargyltrimethylsilane, tetramethylsilane, trimethylsilylacetylene, 1-(trimethylsilyl)-1-propyne, tris(trimethylsilyl)methane, tristtrimethylsilyllsilane, vinyltrimethylsilane, hexamethyldisilane, octamethylcyclotetrasiloxane, tetramethylcyclotetrasiloxane, hexamethyl cyclotetrasiloxane, and M silicate 51.

Examples of a decomposition gas which decomposes these raw material gasses containing silicon and produces an inorganic sealing material are: hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, water vapor, fluorine gas, hydrogen fluoride, trifluoroacetic alcohol, trifluorotoluene, hydrogen sulfide, sulfur dioxide, carbon disulfide, and chlorine gas.

By suitably selecting a raw material gas containing silicon and a decomposition gas, it can obtain an inorganic sealing material containing silicon oxide, nitride or carbide.

It is used a nitrogen gas or elements of group 18 in the periodic table as a discharge gas. Specifically, it is used: helium, neon, argon, krypton, xenon or radon. Of these, nitrogen, helium and argon are preferably used.

The above-described discharge gas and a reactive gas are mixed, and this is supplied as a thin layer forming (mixture) gas in an atmospheric pressure plasma generating apparatus (plasma generating apparatus) to result in formation of a layer. Although a ratio of a discharge gas to a reactive gas will be different depending on the layer property to be obtained, a reactive gas is supplied so that a ratio of a discharge gas is made to be 50% or more based on the total mixture gas.

In particular, a polymer substrate produced in a thin film is preferably used for a sealing member from the viewpoint of achieving a thin element. A thin film shaped polymer substrate is preferably provided with the following properties: an oxygen permeability of $1 \times 10^{-3}$ ml/(m2.24 h·atm) or less, determined based on JIS K 7126-1987; and a water vapor permeability of $1 \times 10^{-3}$ g/(m2.24 h) or less ($25 \pm 0.5°$ C., and $90 \pm 2\%$ RH), determined based on JIS K 7129-1992.

The aforesaid substrate materials may be processed to form a concave form to become a sealing member. In this case, a concave form is formed by carrying out a process such as a sand blast process or a chemical etching process to the aforesaid substrate materials.

A metal material may be used other than these materials. Examples of a metal material are: those composed of at least one metal selected from the group consisting of stainless steel, iron, copper, aluminum, magnesium, nickel, zinc, chromium, titanium, molybdenum, silicon, germanium, and tantalum, or alloys thereof. These metal materials are made into a thin film, and they are used as a sealing member 18. Thus, an entire light emitting panel provided with an organic electroluminescent element will be made thinner.

EXAMPLES

Hereafter, the present invention will be described specifically by referring to Examples, however, the present invention is not limited to them. The compositions of organic EL element prepared in Examples are listed in Table 1. The forming methods and conditions of organic EL elements prepared shown in Table 1 will be described.

mixed with a ratio of 4:1 (mass ratio). Then, a suitable amount of dibutyl ether was added to adjust a dried layer thickness. Thus, each coating solution was prepared.

TABLE 1

| Organic EL Element No. | Substrate | First gas barrier layer (nm) | Adhesive Kind | Adhesive Thickness (μm) | Intermediate layer Material | Intermediate layer Thickness (μm) | Second gas barrier layer (nm) | Third gas barrier layer (nm) | Remarks |
|---|---|---|---|---|---|---|---|---|---|
| 1 | A | — | — | — | — | — | 100 | 250 | Comparative example |
| 2 | A | — | — | — | — | — | 100 | 250 | Comparative example |
| 3 | A | — | — | — | — | — | 200 | 250 | Comparative example |
| 4 | A | — | — | — | — | — | 200 | 750 | Comparative example |
| 5 | A | — | — | — | — | — | 200 | 250 | Comparative example |
| 6 | A | — | — | — | — | — | 500 | 250 | Comparative example |
| 7 | A | — | — | — | — | — | 1000 | 250 | Comparative example |
| 8 | A | 300 | Pressure-sensitive type | 25 | PET | 36 | 300 | 250 | Comparative example |
| 9 | — | 150 | — | — | PET | 12 | 100 | 250 | Inventive example |
| 10 | — | 150 | — | — | PET | 136 | 100 | 250 | Inventive example |
| 11 | — | 150 | — | — | PET | 136 | 100 | 250 | Inventive example |
| 12 | — | 100 | — | — | PET | 136 | 100 | 250 | Inventive example |
| 13 | — | 300 | — | — | PET | 136 | 200 | 250 | Inventive example |
| 14 | — | 300 | — | — | PET | 136 | 400 | 250 | Inventive example |
| 15 | — | 150 | — | — | PET | 136 | 300 | 250 | Inventive example |
| 16 | — | 150 | — | — | PET | 136 | 300 | 500 | Inventive example |
| 17 | — | 150 | — | — | PET | 188 | 300 | 750 | Inventive example |
| 18 | — | 150 | — | — | PET | 250 | 300 | 750 | Inventive example |
| 19 | B | 150 | Heat-curable type | 20 | PET | 136 | 300 | 750 | Inventive example |
| 20 | B | 150 | Pressure-sensitive type | 25 | PET | 136 | 300 | 750 | Inventive example |
| 21 | B | 150 | Pressure-sensitive type | 25 | PET | 36 | 300 | 750 | Inventive example |
| 22 | B | 150 | Pressure-sensitive type | 25 | PET | 136 | 300 | 750 | Inventive example |
| 23 | B | 150 | Pressure-sensitive type | 25 | PET | 36 | 300 | 750 | Inventive example |

<<Preparation of Organic EL Element 1>>
<Formation of Second Gas Barrier Layer>

On a PET film provided with hard coats on both sides having a total thickness of 136 μm and a thickness of PET of 125 μm (hereafter, it is called as "a substrate A") was formed a second gas bather layer having a thickness of 100 nm under the following layer forming conditions with one time layer formation.
(Layer Forming Conditions)
Transport rate: 7 (m/min)
Supplying amount of raw material gas (HMDSO: hexamethylene disiloxane): 150 (sccm)
Supplying amount of oxygen: 500 (sccm)
Vacuum level: 1.5 Pa
Impressed electric power: 4.5 kW
Frequency of electric source: 90 kHz A layer forming apparatus employed was a roll-to-roll CVD film forming apparatus having a first layer forming portion and a second layer forming portion, which is described in JP-A 2008-196001 (refer to FIG. 5).

A layer thickness was measured using a cross-section TEM (a cross-section image obtained by transmission electron microscope: TEM). The composition in the thickness direction of the second gas barrier layer was determined by surface treatment with an ion sputtering method and XPS analysis. It was confirmed that the second gas barrier layer contained silicon, carbon and oxygen, and that an element distribution had an extremum point.
<Formation of Third Gas Barrier Layer>

First, a dibutyl ether solution containing 20 mass % of perhydropolysilazane (NN120-20, made by AZ Electronic Materials Co.) and a dibutyl ether solution containing 20 mass % of perhydropolysilazane and an amine catalyst (N,N,N',N'-tetramethyl-1,6-diaminohexane (TMDHA)) (NAX 120-20, made by AZ Electronic Materials Co.) were A coating solution was applied with a spin coat method to achieve a layer of a dried layer thickness of 250 nm, then, the layer was dried at 80° C. for 2 minutes.

Subsequently, a vacuum UV irradiation treatment was performed to the dried coated layer using a Xe lamp (wavelength of 172 nm) with an oxygen content of 0.1 volume %, and irradiation energy of 3.0 (J/cm2) to form a third gas barrier layer.
<Formation of Light Emitting Unit>

The substrate having been formed to the third gas barrier layer was fixed to a substrate holder in a sputtering apparatus available on the market. ITO was used as a target, then, after reducing the pressure of the vacuum tank to 4×10-4 Pa, a first electrode having a thickness of 150 nm was formed at a deposition rate of 0.1 to 0.2 nm/sec.

Subsequently, the substrate which was prepared to the first electrode was fixed to a substrate holder of the vacuum deposition apparatus available on the market. Then, after reducing the pressure of the vacuum tank to 1×10-4 Pa, a compound HT-1 was vapor deposited onto the substrate at a deposition rate of 0.1 nm/sec, while transporting the substrate, whereby it was produced a hole transport layer (HTL) having a thickness of 20 nm.

Subsequently, there were vapor deposited a compound A-3 (blue light emitting dopant), a compound A-1 (green light emitting dopant), a compound A-2 (red light emitting dopant), and a compound H-1 (host compound) in such a manner that the content of the compound A-3 was linearly varied from 35 mass % to 5 mass % in the thickness direction by changing the deposition rate depending on the place; the compound A-1 and the compound A-2 were formed regardless of the thickness to have the content of 0.2 mass % at a deposition rate of 0.0002 nm/sec; and the compound H-1 was varied from 64.6 mass % to 94.6 mass % by changing the deposition rate depending on the place, whereby a light emitting layer having a thickness of 70 nm was formed with co-deposition.

Further, a compound ET-1 was vapor deposited to form an electron transport layer having a thickness of 30 nm Subsequently, 2 nm thick potassium fluoride (KF) was vapor deposited to form an electron injection layer. Moreover, aluminum was vapor deposited with a thickness of 100 nm to form a second electrode.

Here the aforesaid compound HT-1, compounds A-1, A-2 and A-3, compound H-1 and compound ET-1 are compounds indicated below.

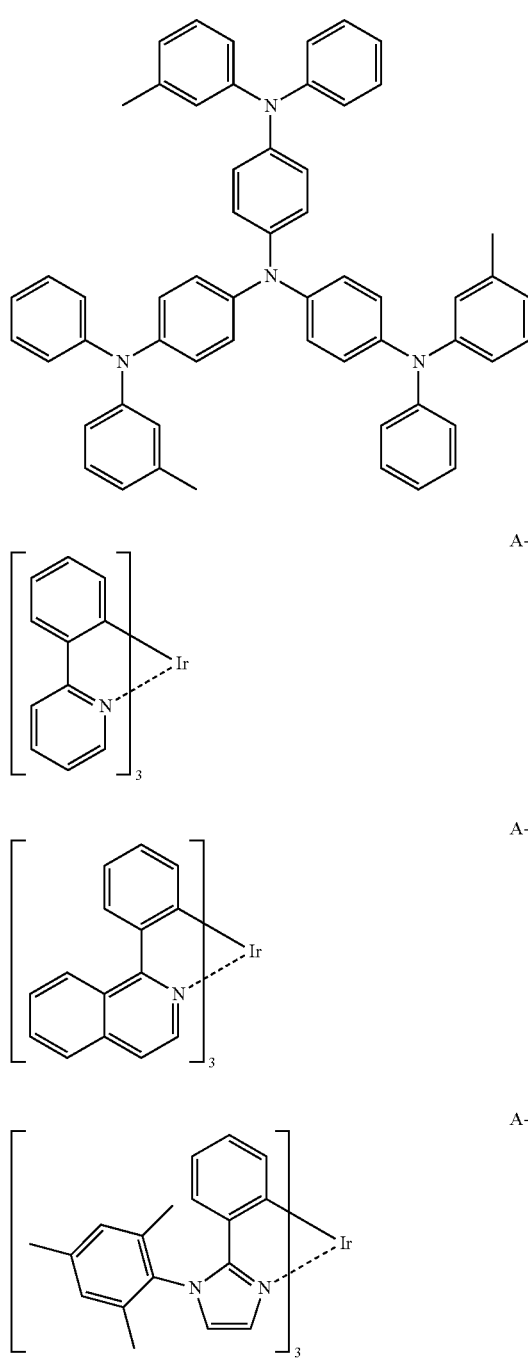

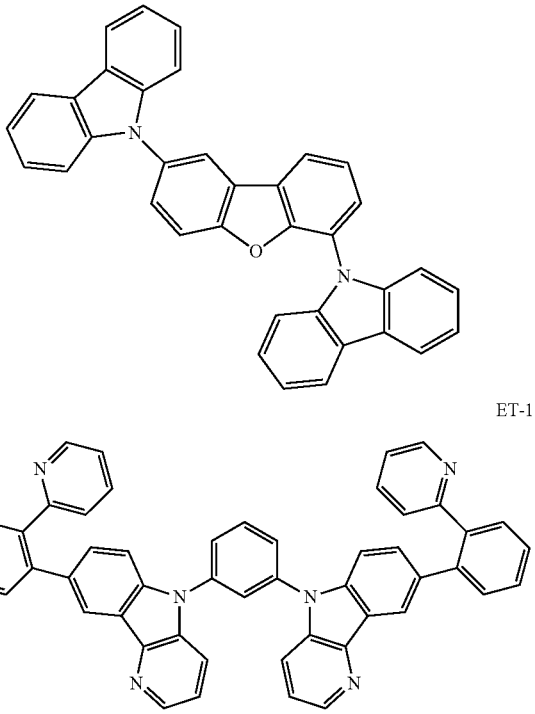

<Sealing Process>

Subsequently, the substrate which was prepared to the second electrode was transferred to an environment having a measured cleanness of class 100, which was conformed with JIS B 9920-2002, at an atmospheric pressure with a nitrogen environment having a water content of 1 ppm or less and an oxygen concentration of 0.8 ppm or less, and a dew point of −80° C. or less.

Subsequently, an aluminum foil (thickness of 100 μm) laminated with a polyethylene terephthalate (PET) resin was used as a sealing member. On the aluminum side of this sealing member was coated with a heat curing liquid adhesive (an epoxy resin TB 1655, made by Three Bond Co. Ltd.) with a thickness of 20 μm as a sealing layer. Then, this pasted sealing member was superposed on the substrate having been prepared to the second electrode. At this moment, the adhesive forming surface of the sealing member and the organic functional layer surface were continuously superposed in a manner that the edge portions of the taking out electrodes of the first electrode and the second electrode were made outside.

Then, the sample was placed in a reduced pressure apparatus, and the superposed substrate and the sealing member were pressed at 90° C. with 0.1 MPa and they were kept together for 5 minutes.

Subsequently, the sample was transferred to an atmospheric pressure environment, followed by heated at 110° C. for 30 minutes to cure the adhesive. Thus, Organic EL element 1 was produced.

In addition, the formation process of the taking out wirings of the first electrode and the second electrode were omitted in this description.

<<Preparation of Organic EL Element 2>>
<Formation of Second Gas Barrier Layer>

On a substrate A was formed a second gas barrier layer having a thickness of 100 nm under the following layer forming conditions with one time layer formation.

Figure 5:
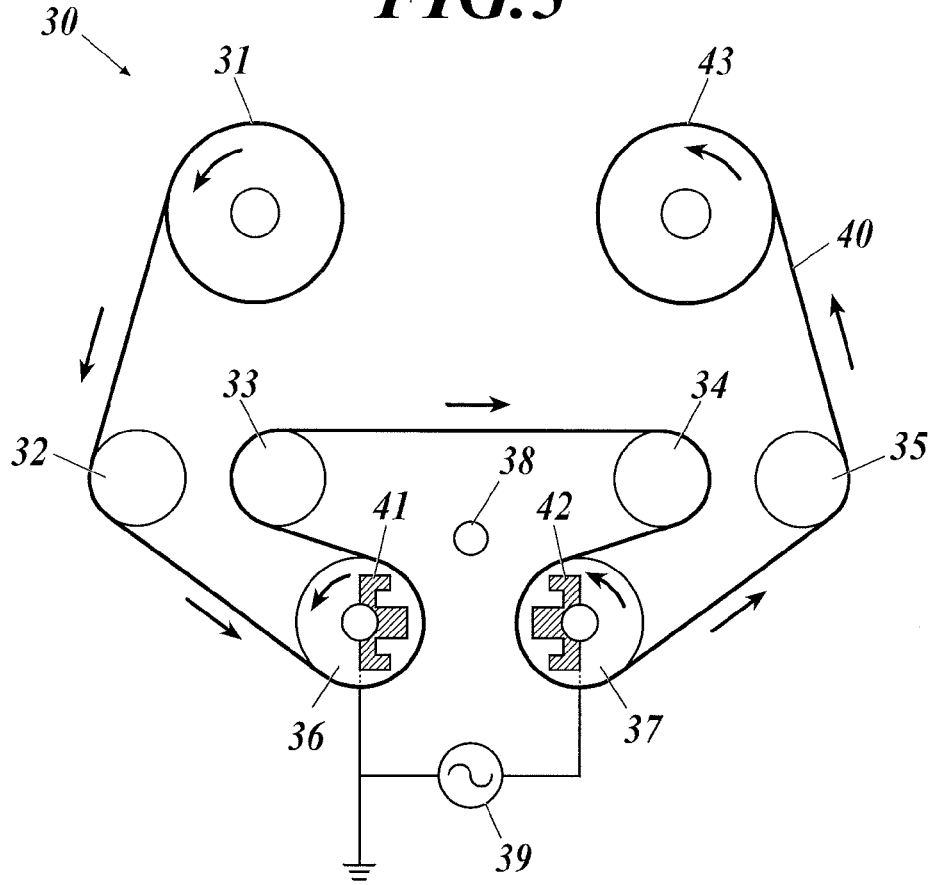
FIG. 5 is a drawing showing a composition of a manufacturing apparatus of a gas barrier layer.

(Layer Forming Conditions)
Transport rate: 10 (m/min)
Supplying amount of raw material gas (HMDSO: hexamethylene disiloxane): 150 (sccm)
Supplying amount of oxygen: 500 (sccm)
Supplying amount of ammonia gas (NH3): 500 (sccm)
Vacuum level: 1.5 Pa
Impressed electric power: 4.5 kW
Frequency of electric source: 90 kHz A layer forming apparatus employed was a roll-to-roll CVD film forming apparatus having a first layer forming portion and a second layer forming portion, which is described in JP-A 2008-196001 (refer to FIG. 5).

A layer thickness was measured using a cross-section TEM (a cross-section image obtained by transmission electron microscope: TEM). The composition in the thickness direction of the second gas barrier layer was determined by surface treatment with an ion sputtering method and XPS analysis. It was confirmed that the second gas barrier layer contained silicon, carbon, oxygen and nitrogen; and that an element distribution had an extremum point.

<Formation of Third Gas Barrier Layer>
A third gas barrier layer of Organic EL element 2 was formed by the same formation method as used for Organic EL element 1 with one time layer formation. Thus the third gas barrier layer having a dried layer thickness of 250 nm was prepared.

<Formation of Light Emitting Unit>
A light emitting unit was formed on the third gas barrier layer by the same formation method as used for Organic EL element 1.

<Sealing Process>
Sealing was done in the same way as done for Organic EL element 1. Thus, Organic EL element 2 was produced.

<<Preparation of Organic EL Element 3>>
<Formation of Second Gas Barrier Layer>
On a substrate A was formed a second gas barrier layer under the same layer forming conditions used for Organic EL element 1 with two times of layer formation. A second gas barrier layer having a thickness of 200 nm was formed.

<Formation of Third Gas Barrier Layer>
A third gas barrier layer was formed by the same formation method as used for Organic EL element 1 with one time layer formation. A third gas barrier layer having a dried layer thickness of 250 nm was prepared.

<Formation of Light Emitting Unit>
A light emitting unit was formed under the same layer forming conditions as used for Organic EL element 1 except that the following underlayer, a first conductive layer and a second conductive layer were formed as a first electrode.

First, an underlayer liquid was prepared by adding γ-mercaptopropyltrimethoxysilan to become an amount of 0.01 mass % to an aqueous acetic acid (pH=4.5).

Subsequently, this underlayer liquid was coated on the third gas barrier layer with a wire-bar to have a wet thickness of 3 μm. Then, the coated layer was dried at 100° C. for 15 minutes to form an underlayer.

Subsequently, on the underlayer was printed a silver nano-particle paste (M-Dot™, average particle size of 20 nm, made by SLP Mitsuboshi Belting, Ltd.) with a gravure printing testing machine so as to have a thin line grate with a line width of 50 μm, a height of 1.5 μm, an interval of 1.0 mm. Then, the printed pattern was subjected to a cure treatment at 110° C. for 5 minutes to form a first conductive layer.

Subsequently, it was prepared a coating liquid by mixing: 7.8 g of conductive polymer Baytron PH510 (solid content of 1.7%, made by H. C. Starck Co.); 1.7 g of 20% aqueous solution of poly(2-hydroxyethyl acrylate); and 0.5 g of DMSO. Then, after adding 40 μm of 10% aqueous sulfuric acid to the mixture followed by stirring, the mixture was filtered with a filter having a mesh of 20 μm. Thus, the coating liquid was prepared. This coating liquid was coated on the first conductive layer with a spin coater to form a layer with a thickness of 300 nm after drying, and the layer was subjected to a heating treatment at 110° C. for 30 minutes to form a second conductive layer. The other composition of the light emitting unit was formed in the same way used for Organic EL element 1.

<Sealing Process>
Sealing was done in the same way as done for Organic EL element 1. Thus, Organic EL element 3 was produced.

<<Preparation of Organic EL Element 4>>
<Formation of Second Gas Barrier Layer>
On a substrate A was formed a second gas barrier layer under the same layer forming conditions used for Organic EL element 1 with two times of layer formation. A second gas barrier layer having a thickness of 200 nm was formed.

<Formation of Third Gas Barrier Layer>
A third gas bather layer was formed by the same formation method as used for Organic EL element 1 with three times of layer formation. A third gas barrier layer having a dried layer thickness of 750 nm was prepared.

<Formation of Light Emitting Unit>
A light emitting unit was formed in the same way as used for Organic EL element 1, except that a vapor deposition layer containing the following nitrogen containing compound and silver was used as a first electrode.

A substrate formed with a third gas barrier layer beforehand was fixed to a substrate holder of a vacuum deposition apparatus available on the market. Then, a nitrogen containing compound as indicated below was placed in a tungsten resistance heating boat. The substrate holder and the heating boat were placed in the first vacuum tank of the vacuum deposition apparatus. Silver (Ag) was placed in another tungsten resistance heating boat, and it was placed in a second vacuum tank of the vacuum deposition apparatus.

Subsequently, after reducing the pressure of the first vacuum tank to 4×10-4 Pa, the aforesaid heating boat in which the nitrogen containing compound was placed was heated via application of electric current, and a nitrogen containing layer was formed onto the substrate at a deposition rate of 0.1 to 0.2 nm/sec with a thickness of 10 nm.

Subsequently, the substrate formed with the nitrogen containing layer was transported in the second vacuum tank. After reducing the pressure of the second vacuum tank to 4×10-4 Pa, the aforesaid heating boat in which silver (Ag) was placed was heated via application of electric current. Thus, a first electrode made of silver (Ag) having a thickness of 8 nm was formed at a deposition rate of 0.1 to 0.2 nm/sec.

Here the aforesaid nitrogen containing compound employed is a compound indicated below. The other composition of the light emitting unit was formed in the same way used for Organic EL element 1.

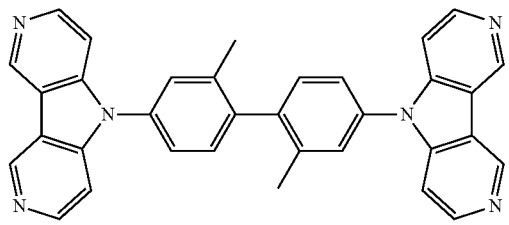 [SMILES: Cc1cc(-n2c3ccncc3c3cnccc32)ccc1-c1ccc(-n2c3ccncc3c3cnccc32)cc1C]

<Sealing Process>

Sealing was done in the same way as done for Organic EL element 1. Thus, Organic EL element 4 was produced.

<<Preparation of Organic EL Element 5>>
<Formation of Second Gas Barrier Layer>

On a substrate A was formed a second gas barrier layer under the same layer forming conditions used for Organic EL element 1 with two times of layer formation. A second gas bather layer having a thickness of 200 nm was formed.

<Formation of Third Gas Bather Layer>

A third gas bather layer was formed by the same formation method as used for Organic EL element 1 with one time layer formation. A third gas barrier layer having a dried layer thickness of 250 nm was prepared.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 5 was produced.

<<Preparation of Organic EL Element 6>>
<Formation of Second Gas Barrier Layer>

On a substrate A was formed a second gas barrier layer under the same layer forming conditions used for Organic EL element 1 with five times of layer formation. A second gas bather layer having a thickness of 500 nm was formed.

<Formation of Third Gas Barrier Layer>

A third gas bather layer was formed by the same formation method as used for Organic EL element 1 with one time layer formation. A third gas barrier layer having a dried layer thickness of 250 nm was prepared.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 6 was produced.

<<Preparation of Organic EL Element 7>>
<Formation of Second Gas Barrier Layer>

On a substrate A was formed a second gas barrier layer under the same layer forming conditions used for Organic EL element 1 with ten times of layer formation. A second gas barrier layer having a thickness of 1,000 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 7 was produced.

<<Preparation of Organic EL Element 8>>
<Formation of First Gas Barrier Layer>

On a substrate A was formed a layer in a usual way using a known batch type sputtering apparatus. A first gas barrier layer made of silicon oxide (SiO2) having a thickness of 300 nm was prepared.

Specifically, a substrate A was placed in a vacuum tank of a sputtering apparatus. After reducing the tank to about 10-4 Pa, and keeping the inner temperature of the tank to be 150° C., a discharge gas of argon was introduced with a partial pressure of 0.1 Pa, and a reactive gas of oxygen was introduced with a partial pressure of 0.008 Pa.

After achieving a stable state of the environment pressure and the temperature, discharge was started with a sputtering electric power of 2 W/cm2, and plasma was generated on a Si target. A sputtering process was started. After getting a stable process condition, a shutter was opened and formation of a first gas barrier layer on the substrate A was started. After depositing a layer having a thickness of 300 nm, the shutter was closed and layer formation was finished.

<Formation of Second Gas Barrier Layer>

On a PET film having a thickness of 36 μm used as an intermediate layer was formed a second gas barrier layer having a thickness of 300 nm in the same way as forming a first gas barrier layer of Organic EL element 8.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of Light Emitting Unit>

A light emitting unit was formed on the third gas barrier layer by the same formation method as used for Organic EL element 4.

<Pasting Process>

On the first gas barrier layer formed on the substrate A was superposed still a pressure-sensitive adhesive in 25 μm sheet (Double tack tape No. 5402, made by Sekisui Co. Ltd.). Then, the pressure-sensitive adhesive was laminated with a surface of the PET film opposite to other surface of the PET film on which the second gas barrier layer was formed. They were pasted together using a roll laminator at normal temperature.

<Sealing Process>

Sealing was done in the same way as done for Organic EL element 1. Thus, Organic EL element 8 was produced.

<<Preparation of Organic EL Element 9>>
<Formation of Second Gas Barrier Layer>

On a PET film having a thickness of 12 μm used as an intermediate layer was formed a second gas barrier layer under the same layer forming conditions used for Organic EL element 1 with one time layer formation. A second gas barrier layer having a thickness of 100 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.

<Formation of Light Emitting Unit>

A light emitting unit was formed on the third gas barrier layer by the same formation method as used for Organic EL element 1.

<Sealing Process>

Sealing was done in the same way as done for Organic EL element 1. Thus, Organic EL element 9 was produced.

<<Preparation of Organic EL Element 10>>
<Formation of Second Gas Barrier Layer>

On a PET film having a thickness of 136 μm used as an intermediate layer was formed a second gas barrier layer under the same layer forming conditions used for Organic EL element 1 with one time layer formation. A second gas barrier layer having a thickness of 100 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.

<Formation of Light Emitting Unit>

A light emitting unit was formed on the third gas barrier layer by the same formation method as used for Organic EL element 1.

<Sealing Process>

Sealing was done in the same way as done for Organic EL element 1. Thus, Organic EL element 10 was produced.

<<Preparation of Organic EL Element 11>>
<Formation of Second Gas Barrier Layer>

On a PET film having a thickness of 136 μm used as an intermediate layer was formed a second gas barrier layer under the same layer forming conditions used for Organic EL element 2 with one time layer formation. A second gas barrier layer having a thickness of 100 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.

<Formation of Light Emitting Unit>

A light emitting unit was formed on the third gas barrier layer by the same formation method as used for Organic EL element 1.

<Sealing Process>

Sealing was done in the same way as done for Organic EL element 1. Thus, Organic EL element 11 was produced.

<<Preparation of Organic EL Element 12>>
<Formation of Second Gas Barrier Layer>

On a PET film having a thickness of 136 μm used as an intermediate layer was formed a second gas barrier layer under the same layer forming conditions used for Organic EL element 1 with one time layer formation. A second gas barrier layer having a thickness of 100 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. A first gas barrier layer having a thickness of 100 nm was formed under the same layer forming conditions used for forming the second gas barrier layer of Organic EL element 1 with one time layer formation.

<Formation of Light Emitting Unit>

A light emitting unit was formed on the third gas barrier layer by the same formation method as used for Organic EL element 3.

<Sealing Process>

Sealing was done in the same way as done for Organic EL element 1. Thus, Organic EL element 12 was produced.

<<Preparation of Organic EL Element 13>>
<Formation of Second Gas Barrier Layer>

On a PET film having a thickness of 136 μm used as an intermediate layer was formed a second gas barrier layer under the same layer forming conditions used for Organic EL element 1 with two times of layer formation. A second gas barrier layer having a thickness of 200 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. Silicon oxide (SiO2) layer was formed to have a thickness of 300 nm using the same method as used for forming the first gas barrier layer of Organic EL element 8. A first gas barrier layer having a thickness of 300 nm was produced.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 13 was produced.

<<Preparation of Organic EL Element 14>>
<Formation of Second Gas Barrier Layer>

On a PET film having a thickness of 136 μm used as an intermediate layer was formed a second gas barrier layer under the same layer forming conditions used for Organic EL element 1 with four times of layer formation. A second gas barrier layer having a thickness of 400 nm was formed.

<Formation of Third Gas Barrier Layer>

A third gas barrier layer was formed by the same formation method as used for Organic EL element 1 with one time layer formation. A third gas barrier layer having a dried layer thickness of 250 nm was prepared.

<Formation of First Gas Barrier Layer>

A first gas barrier layer was formed on a surface of the PET film opposite to other surface of the PET film on which the second gas barrier layer and the third gas barrier layer were formed. Silicon oxide (SiO2) layer was formed to have a thickness of 300 nm using the same method as used for forming the first gas barrier layer of Organic EL element 8. A first gas barrier layer having a thickness of 300 nm was produced.

<Formation of Light Emitting Unit>
A light emitting unit was formed on the third gas barrier layer by the same formation method as used for Organic EL element 4.
<Sealing Process>
Sealing was done in the same way as done for Organic EL element 1. Thus, Organic EL element 14 was produced.
<<Preparation of Organic EL Element 15>>
<Formation of Second Gas Barrier Layer>
On a PET film having a thickness of 136 µm used as an intermediate layer was formed a second gas barrier layer under the same layer forming conditions used for Organic EL element 1 with three times of layer formation. A second gas barrier layer having a thickness of 300 nm was formed.
<Formation of Third Gas Barrier Layer>
A third gas bather layer was formed by the same formation method as used for Organic EL element 1 with one time layer formation. A third gas barrier layer having a dried layer thickness of 250 nm was prepared.
<Formation of First Gas Barrier Layer>
A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.
<Formation of Light Emitting Unit>
A light emitting unit was formed on the third gas barrier layer by the same formation method as used for Organic EL element 4.
<Sealing Process>
Sealing was done in the same way as done for Organic EL element 1. Thus, Organic EL element 15 was produced.
<<Preparation of Organic EL Element 16>>
<Formation of Second Gas Barrier Layer>
On a PET film having a thickness of 136 µm used as an intermediate layer was formed a second gas barrier layer under the same layer forming conditions used for Organic EL element 1 with three times of layer formation. A second gas barrier layer having a thickness of 300 nm was formed.
<Formation of Third Gas Barrier Layer>
A third gas barrier layer was formed by the same formation method as used for Organic EL element 1 with two times of layer formation. A third gas barrier layer having a dried layer thickness of 500 nm was prepared.
<Formation of First Gas Barrier Layer>
A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.
<Formation of Light Emitting Unit>
A light emitting unit was formed on the third gas barrier layer by the same formation method as used for Organic EL element 4.
<Sealing Process>
Sealing was done in the same way as done for Organic EL element 1. Thus, Organic EL element 16 was produced.
<<Preparation of Organic EL Element 17>>
<Formation of Second Gas Barrier Layer>
On a PET film having a thickness of 188 µm used as an intermediate layer was formed a second gas barrier layer under the same layer forming conditions used for Organic EL element 1 with three times of layer formation. A second gas barrier layer having a thickness of 300 nm was formed.
<Formation of Third Gas Barrier Layer>
A third gas barrier layer was formed by the same formation method as used for Organic EL element 1 with three times of layer formation. A third gas barrier layer having a dried layer thickness of 750 nm was prepared.
<Formation of First Gas Barrier Layer>
A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.
<Formation of Light Emitting Unit>
A light emitting unit was formed on the third gas barrier layer by the same formation method as used for Organic EL element 4.
<Sealing Process>
Sealing was done in the same way as done for Organic EL element 1. Thus, Organic EL element 17 was produced.
<<Preparation of Organic EL Element 18>>
<Formation of Second gas Barrier Layer>
On a PET film having a thickness of 250 µm used as an intermediate layer was formed a second gas barrier layer under the same layer forming conditions used for Organic EL element 1 with three times of layer formation. A second gas barrier layer having a thickness of 300 nm was formed.
<Formation of Third Gas Barrier Layer>
A third gas barrier layer was formed by the same formation method as used for Organic EL element 1 with three times of layer formation. A third gas barrier layer having a dried layer thickness of 750 nm was prepared.
<Formation of First Gas Barrier Layer>
A first gas barrier layer was formed on a surface of the PET film opposite to other surface of the PET film on which the second gas barrier layer and the third gas barrier layer were formed. Silicon oxide (SiO2) layer was formed to have a thickness of 150 nm using the same method as used for forming the first gas barrier layer of Organic EL element 8. A first gas barrier layer having a thickness of 150 nm was produced.
<Formation of Light Emitting Unit>
A light emitting unit was formed on the third gas barrier layer by the same formation method as used for Organic EL element 4.
<Sealing Process>
Sealing was done in the same way as done for Organic EL element 1.
Thus, Organic EL element 18 was produced.
<<Preparation of Organic EL Element 19>>
<Formation of Second Gas Barrier Layer>
On a PET film having a thickness of 136 µm used as an intermediate layer was formed a second gas barrier layer under the same layer forming conditions used for Organic EL element 1 with three times of layer formation. A second gas barrier layer having a thickness of 300 nm was formed.
<Formation of Third Gas Barrier Layer>
A third gas barrier layer was formed by the same formation method as used for Organic EL element 1 with three times of layer formation. A third gas barrier layer having a dried layer thickness of 750 nm was prepared.

<First Gas Barrier Layer>

On a PET film provided with hard coats on both sides having a total thickness of 36 μm and a thickness of PET of 25 μm (hereafter, it is called as "a substrate B") was formed a first gas barrier layer. Silicon oxide (SiO2) layer was formed to have a thickness of 150 nm using the same method as used for forming the first gas barrier layer of Organic EL element 8. A first gas barrier layer having a thickness of 150 nm was produced.

<Pasting Process>

On the first gas barrier layer formed on the substrate B was bonded a heat-curable resin in 20 μm sheet (TB 1655, made by Three Bond Co. Ltd.) as an adhesive layer using a roll laminator heated at 90° C.

Subsequently, a surface of the PET film opposite to other surface of the PET film on which the second gas barrier layer and the third gas barrier layer were formed was laminated with a surface of the adhesive layer opposite to other surface of the adhesive layer on which was bonded the first gas barrier layer made of the heat-curable resin. They were bonded together using a roll laminator heated at 90° C. They were kept still at 100° C. for 30 minutes to cure the heat-curable resin.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 19 was produced.

<<Preparation of Organic EL Element 20>>
<Formation of Second Gas Barrier Layer>

On a PET film having a thickness of 136 μm used as an intermediate layer was formed a second gas barrier layer under the same layer forming conditions used for Organic EL element 1 with three times of layer formation. A second gas barrier layer having a thickness of 300 nm was formed.

<Formation of Third Gas Barrier Layer>

A third gas barrier layer was formed by the same formation method as used for Organic EL element 1 with three times of layer formation. A third gas barrier layer having a dried layer thickness of 750 nm was prepared.

<First Gas Barrier Layer>

On a substrate B was formed a first gas barrier layer. Silicon oxide (SiO2) layer was formed to have a thickness of 150 nm using the same method as used for forming the first gas barrier layer of Organic EL element 8. A first gas barrier layer having a thickness of 150 nm was produced.

<Pasting Process>

On the first gas barrier layer formed on the substrate B was bonded a pressure-sensitive resin in 25 μm sheet (Double tack tape No. 5402, made by Sekisui Co. Ltd.) as an adhesive layer using a roll laminator at normal temperature.

Subsequently, a surface of the PET film opposite to other surface of the PET film on which the second gas barrier layer and the third gas barrier layer were formed was laminated with a surface of the adhesive layer opposite to other surface of the adhesive layer on which was bonded the first gas barrier layer on the substrate B. They were bonded together using a roll laminator at normal temperature.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 20 was produced.

<<Preparation of Organic EL Element 21>>
<Formation of Second Gas Barrier Layer>

On a PET film having a thickness of 36 μm used as an intermediate layer was formed a second gas barrier layer under the same layer forming conditions used for Organic EL element 1 with three times of layer formation. A second gas barrier layer having a thickness of 300 nm was formed.

<Formation of Third Gas Barrier Layer>

A third gas barrier layer was formed by the same formation method as used for Organic EL element 1 with three times of layer formation. A third gas barrier layer having a dried layer thickness of 750 nm was prepared.

<First Gas Barrier Layer>

On a substrate B was formed a first gas barrier layer. Silicon oxide (SiO2) layer was formed to have a thickness of 150 nm using the same method as used for forming the first gas barrier layer of Organic EL element 8. A first gas barrier layer having a thickness of 150 nm was produced.

<Pasting Process>

On the first gas barrier layer formed on the substrate B was bonded a pressure-sensitive resin in 25 μm sheet (Double tack tape No. 5402, made by Sekisui Co. Ltd.) as an adhesive layer using a roll laminator at normal temperature.

Subsequently, a surface of the PET film opposite to other surface of the PET film on which the second gas barrier layer and the third gas barrier layer were formed was laminated with a surface of the adhesive layer opposite to other surface of the adhesive layer on which was bonded the first gas barrier layer on the substrate B. They were bonded together using a roll laminator at normal temperature.

<Formation of Light Emitting Unit>

A light emitting unit was formed on the third gas barrier layer by the same formation method as used for Organic EL element 4.

<Sealing Process>

Sealing was done in the same way as done for Organic EL element 1. Thus, Organic EL element 21 was produced.

<<Preparation of Organic EL Element 22>>
<First Gas Barrier Layer>

On a substrate B was formed a first gas barrier layer. Silicon oxide (SiO2) layer was formed to have a thickness of 150 nm using the same method as used for forming the first gas barrier layer of Organic EL element 8. A first gas barrier layer having a thickness of 150 nm was produced.

<Formation of Second Gas Barrier Layer>

On a PET film having a thickness of 136 μm used as an intermediate layer was formed a second gas barrier layer under the same layer forming conditions used for Organic EL element 1 with three times of layer formation. A second gas barrier layer having a thickness of 300 nm was formed.

<Formation of Third Gas Barrier Layer>

A third gas barrier layer was formed by the same formation method as used for Organic EL element 1 with three times of layer formation. A third gas barrier layer having a dried layer thickness of 750 nm was prepared.

<Formation of Light Emitting Unit>

A light emitting unit was formed on the third gas barrier layer by the same formation method as used for Organic EL element 4.

<Pasting Process>

On the first gas barrier layer formed on the substrate B was placed still a pressure-sensitive resin in 25 μm sheet (Double tack tape No. 5402, made by Sekisui Co. Ltd.).

Subsequently, it was laminated with a surface of the PET film opposite to other surface on which the layers were formed. They were pasted together using a roll laminator at normal temperature.

<Sealing Process>

Sealing was done in the same way as done for Organic EL element 1. Thus, Organic EL element 22 was produced.

<<Preparation of Organic EL Element 23>>

<First Gas Barrier Layer>

On a substrate B was formed a first gas barrier layer. Silicon oxide (SiO2) layer was formed to have a thickness of 150 nm using the same method as used for forming the first gas barrier layer of Organic EL element 8. A first gas barrier layer having a thickness of 150 nm was produced.

<Formation of Second Gas Barrier Layer>

On a PET film having a thickness of 36 μm was formed a second gas barrier layer under the same layer forming conditions used for Organic EL element 1 with three times of layer formation. A second gas barrier layer having a thickness of 300 nm was formed.

<Formation of Third Gas Barrier Layer>

A third gas barrier layer was formed by the same formation method as used for Organic EL element 1 with three times of layer formation. A third gas barrier layer having a dried layer thickness of 750 nm was prepared.

<Formation of Light Emitting Unit>

A light emitting unit was formed on the third gas barrier layer by the same formation method as used for Organic EL element 4.

<Pasting Process>

On the first gas barrier layer formed on the substrate B was placed still a pressure-sensitive resin in 25 μm sheet (Double tack tape No. 5402, made by Sekisui Co. Ltd.). Subsequently, it was laminated with a surface of the PET film opposite to other surface on which the layers were formed. They were pasted together using a roll laminator at normal temperature.

<Sealing Process>

Sealing was done in the same way as done for Organic EL element 1. Thus, Organic EL element 23 was produced.

[Evaluation of Storage Property]

A storage property of the prepared organic EL elements was evaluated as follows. A prepared organic EL element sample was kept in a flat condition and it was subjected to the following cycle test: to keep the sample at 85° C. and 85% RH for 120 minutes; to decrease the temperature to −40° C. over a period of 90 minutes and to keep at −40° C. for 120 minutes without specifically adjusting the humidity; and to increase the temperature to 85° C. (with humidity of 85% RH) over a period of 90 minutes and to keep at 85° C. for 80 minutes. An evaluation was done by repeating 100 times of the above-described heat cycle steps.

Subsequently, the organic EL element sample was lighted with a constant voltage electric source. The evaluation was done by finding out the number of generated dark spots having a radius of 150 μm or more per 100 cm2 of light emitting area.

[Bending Resistance Test and External Appearance Evaluation after Bending]

A prepared organic EL element sample was curled around a cylinder having a diameter of 20 mmϕ. Whole maintaining in this state, the sample was kept at 60° C. and 90% RH for 1,000 hours. Then, the sample was lighted with a constant voltage electric source to find out the number of generated dark spots having a radius of 150 μm or more per 100 cm2 of light emitting area. Further, an external appearance of the element samples was visually inspected and evaluated the cracks based on the following criteria. Here, "crack" is a line shape failure which has a width of 0.5 μm or more and a length of 1,000 μm or more.

○: Number of cracks per 100 cm2 of light emitting area is less than 5;

Δ: Number of cracks per 100 cm2 of light emitting area is from 5 to less than 50; and x: Number of cracks per 100 cm2 of light emitting area is 50 or more.

[Impact Test]

A spherical body having a weight of 500 g was freely fallen from the height of 50 cm to come into collision with a prepared organic EL element sample. Subsequently, the organic EL element sample was kept at 60° C. and 90% RH for 1,000 hours while keeping in a flat condition. Then, it was lighted with a constant voltage electric source to find out the number of generated dark spots having a radius of 150 μm or more per 100 cm2 of light emitting area.

Table 1 lists the prepared Organic EL elements with the method as described above. Table 2 shows the evaluation results obtained by using these samples.

TABLE 2

| Organic EL Element No. | Storage property | Bending resistance | External appearance evaluation after bending | Impact resistance | Remarks |
| --- | --- | --- | --- | --- | --- |
| 1 | 102 | 69 | Δ | 105 | Comparative example |
| 2 | 76 | 150 | X | 124 | Comparative example |
| 3 | 54 | 139 | Δ | 217 | Comparative example |
| 4 | 54 | 139 | X | 207 | Comparative example |
| 5 | 35 | 68 | Δ | 101 | Comparative example |
| 6 | 36 | 138 | X | 216 | Comparative example |
| 7 | 36 | 143 | X | 212 | Comparative example |
| 8 | 51 | 46 | Δ | 105 | Comparative example |
| 9 | 15 | 12 | ○ | 41 | Inventive example |
| 10 | 10 | 11 | ○ | 21 | Inventive example |
| 11 | 15 | 21 | ○ | 32 | Inventive example |
| 12 | 9 | 10 | ○ | 21 | Inventive example |
| 13 | 10 | 11 | ○ | 21 | Inventive example |
| 14 | 9 | 12 | ○ | 26 | Inventive example |
| 15 | 7 | 14 | ○ | 27 | Inventive example |
| 16 | 8 | 11 | ○ | 17 | Inventive example |
| 17 | 7 | 11 | ○ | 15 | Inventive example |
| 18 | 6 | 10 | ○ | 14 | Inventive example |
| 19 | 6 | 8 | ○ | 12 | Inventive example |
| 20 | 5 | 7 | ○ | 11 | Inventive example |
| 21 | 5 | 7 | ○ | 12 | Inventive example |
| 22 | 5 | 8 | ○ | 10 | Inventive example |
| 23 | 3 | 3 | ○ | 6 | Inventive example |

From the evaluation results as described above, the Organic EL elements of the present invention were proved to exhibit excellent storage stability, bending resistance and impact resistance.

DESCRIPTION OF SYMBOLS

10A, 10B and 10C: Organic EL element
11: First gas barrier layer
12: Intermediate layer
13: Second gas barrier layer
14: Third gas barrier layer
15: First electrode
16: Organic functional layer
17: Second electrode
18: Light emitting unit
19: Substrate
20: Adhesive
21: Sealing layer
22: Sealing member
30: Manufacturing apparatus
31: Delivery roller
32, 33, 34, and 35: Conveyer roller
36 and 37: Deposition roller
38: Gas inlet
39: Power source for plasma generation
40: Film
41 and 42: Magnetic-field generator
43: Reeling roller

What is claimed is:

1. An organic electroluminescent element comprising: a first gas barrier layer; an intermediate layer; a second gas barrier layer; a third gas barrier layer; a first electrode; an organic functional layer; and a second electrode, in that order,
   wherein the intermediate layer contains a resin and has a thickness of 10 μm to 250 μm;
   the second gas barrier layer contains silicon, carbon and oxygen, wherein a composition of silicon, carbon and oxygen contained in the second gas barrier layer is continuously changed in a thickness direction of the second gas barrier layer, and distribution curves of silicon, carbon and oxygen each have an extremum point; and
   the third gas barrier layer is a polysilazane reforming layer.

2. The organic electroluminescent element described in claim 1,
   wherein a sum of a thickness of the first gas barrier layer and a thickness of the second gas barrier layer is 2,000 nm or less.

3. The organic electroluminescent element described in claim 2,
   wherein the sum of a thickness of the first gas barrier layer and a thickness of the second gas barrier layer is 1,000 nm or less.

4. The organic electroluminescent element described in claim 1,
   wherein the third gas barrier layer is a polysilazane reforming layer formed by irradiation with vacuum UV rays.

5. The organic electroluminescent element described in claim 1,
   wherein the intermediate layer is adhered to the first gas barrier layer via an adhesive.

* * * * *